United States Patent
Booth, Jr. et al.

(10) Patent No.: US 8,936,992 B2
(45) Date of Patent: Jan. 20, 2015

(54) DEEP ISOLATION TRENCH STRUCTURE AND DEEP TRENCH CAPACITOR ON A SEMICONDUCTOR-ON-INSULATOR SUBSTRATE

(71) Applicant: International Business Machines Corporation, Armonk, NY (US)

(72) Inventors: Roger A. Booth, Jr., San Diego, CA (US); Kangguo Cheng, Guilderland, NY (US); Joseph Ervin, Wappingers Falls, NY (US); Chengwen Pei, Danbury, CT (US); Ravi M. Todi, San Diego, CA (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/146,198

(22) Filed: Jan. 2, 2014

(65) Prior Publication Data
US 2014/0120688 A1 May 1, 2014

Related U.S. Application Data

(62) Division of application No. 13/316,104, filed on Dec. 9, 2011.

(51) Int. Cl.
*H01L 21/20* (2006.01)
*H01L 21/70* (2006.01)
(Continued)

(52) U.S. Cl.
CPC ...... *H01L 27/1087* (2013.01); *H01L 27/10829* (2013.01); *H01L 27/1203* (2013.01); *H01L 29/945* (2013.01)

USPC 438/388; 257/301; 257/E21.09; 257/E27.091; 438/243; 438/389; 438/386; 438/241; 438/246; 438/514

(58) Field of Classification Search
USPC ............... 257/508, E27.091, 301, E21.09; 438/243, 241, 246, 386, 388, 389, 514
See application file for complete search history.

(56) References Cited

U.S. PATENT DOCUMENTS

| | | | |
|---|---|---|---|
| 6,498,061 B2 | 12/2002 | Divakaruni et al. | |
| 6,787,853 B2 | 9/2004 | Hidaka et al. | |

(Continued)

OTHER PUBLICATIONS

Office Action dated Jan. 30, 2014 received in a related U.S. Patent Application, namely U.S. Appl. No. 13/316,104.

*Primary Examiner* — Matthew Gordon
(74) *Attorney, Agent, or Firm* — Scully, Scott, Murphy & Presser, P.C.; Joseph P. Abate, Esq.

(57) ABSTRACT

Two trenches having different widths are formed in a semiconductor-on-insulator (SOI) substrate. An oxygen-impermeable layer and a fill material layer are formed in the trenches. The fill material layer and the oxygen-impermeable layer are removed from within a first trench. A thermal oxidation is performed to convert semiconductor materials underneath sidewalls of the first trench into an upper thermal oxide portion and a lower thermal oxide portion, while the remaining oxygen-impermeable layer on sidewalls of a second trench prevents oxidation of the semiconductor materials. After formation of a node dielectric on sidewalls of the second trench, a conductive material is deposited to fill the trenches, thereby forming a conductive trench fill portion and an inner electrode, respectively. The upper and lower thermal oxide portions function as components of dielectric material portions that electrically isolate two device regions.

11 Claims, 20 Drawing Sheets

(51) Int. Cl.
  *H01L 27/108* (2006.01)
  *H01L 27/12* (2006.01)
  *H01L 29/94* (2006.01)

(56) References Cited

U.S. PATENT DOCUMENTS

| | | |
|---|---|---|
| 6,821,865 B2 | 11/2004 | Wise et al. |
| 6,885,080 B2 | 4/2005 | Chen et al. |
| 7,405,099 B2 | 7/2008 | Gogoi |
| 7,800,184 B2 | 9/2010 | Voldman |
| 7,888,723 B2 | 2/2011 | Brodsky et al. |
| 2005/0062100 A1 | 3/2005 | Wu et al. |
| 2009/0014768 A1* | 1/2009 | Lin et al. ............ 257/301 |
| 2009/0176347 A1* | 7/2009 | Cheng et al. ......... 438/388 |
| 2009/0302421 A1 | 12/2009 | Sardana et al. |
| 2010/0213523 A1 | 8/2010 | Cheng et al. |
| 2010/0283093 A1 | 11/2010 | Pei et al. |
| 2011/0133310 A1 | 6/2011 | Anderson et al. |
| 2011/0193193 A1 | 8/2011 | Dube et al. |

* cited by examiner

DEEP ISOLATION TRENCH STRUCTURE AND DEEP TRENCH CAPACITOR ON A SEMICONDUCTOR-ON-INSULATOR SUBSTRATE

CROSS REFERENCE TO RELATED APPLICATION

This application is a divisional of U.S. patent application Ser. No. 13/316,104, filed on Dec. 9, 2011, the entire content and disclosure of which is incorporated herein by reference.

BACKGROUND

The present disclosure relates to a semiconductor structure, and particularly to a semiconductor structure including a deep isolation trench and a deep capacitor trench on a semiconductor-on-insulator substrate and a method of manufacturing the same.

Deep trench capacitors are used in a variety of semiconductor chips for high areal capacitance and low device leakage. Typically, a deep trench capacitor provides a capacitance in the range from 4 fF (femto-Farad) to 120 fF. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

Integration of deep trench capacitors on a semiconductor-on-insulator (SOI) substrate to form embedded DRAM (eDRAM) devices requires electrical isolation between logic device areas and eDRAM areas. Deep isolation trench structures provide superior electrical isolation between adjacent device regions compared to shallow isolation trench structures. However, formation of deep isolation trench structures typically requires extra processing steps because deep isolation trench structures require a thicker dielectric material than a node dielectric of deep trench capacitors. Adding processing steps in the art for formation of deep isolation trench structures to a conventional process flow for forming a DRAM device significantly increases the total processing time and production cost for embedded SOI devices employing deep isolation trench structures.

SUMMARY

Methods are disclosed for forming a deep isolation trench structure and a deep trench capacitor without employing an excessive number of processing steps. Further, semiconductor structures derived from these methods are also disclosed herein.

A first deep trench having a first width and a second deep trench having a second width are formed in a semiconductor-on-insulator (SOI) substrate. The handle substrate of the SOI substrate can include a p-n junction between a first semiconductor layer and a second semiconductor layer such that the first deep trench extends through the p-n junction, while the entirety of the second trench is located above the p-n junction. An oxygen-impermeable layer and a fill material layer are formed sequentially in the first trench and the second trench such that the total thickness of the oxygen-impermeable layer and the fill material layer is less than one half of the width of the first trench, and is greater than one half of the width of the second trench.

The fill material layer and the oxygen-impermeable layer are removed from within the first trench, while a remaining portion of the oxygen-impermeable layer is present over sidewalls of the second trench within the SOI substrate. A thermal oxidation is performed to convert semiconductor materials of a top semiconductor layer and the handle substrate underneath sidewalls of the first trench into an upper thermal oxide portion and a lower thermal oxide portion, while the oxygen-impermeable layer prevents oxidation of the semiconductor materials. After formation of a node dielectric on sidewalls of the second trench, a conductive material is deposited to fill the first trench and the second trench, thereby forming a conductive trench fill portion and an inner electrode, respectively. The second semiconductor layer, the node dielectric, and the inner electrode constitute a deep trench capacitor. The upper and lower thermal oxide portions function as components of dielectric material portions that electrically isolate two device regions.

According to an aspect of the present disclosure, a semiconductor structure includes: a semiconductor-on-insulator (SOI) substrate including a first trench and a second trench extending through a buried insulator layer of the SOI substrate; a bottom semiconductor oxide portion located in the first trench and underneath a bottom surface of the buried insulator layer and including an oxide of a semiconductor material of at least one semiconductor layer located underneath the buried insulator layer; a top semiconductor oxide portion located in the first trench and above a top surface of the buried insulator layer and including an oxide of a semiconductor material of a top semiconductor layer located above the buried insulator layer; a first conductive material portion located in the first trench; a node dielectric located on a sidewall of the second trench; and a second conductive material portion embedded within the node dielectric and including a same material as the first conductive material portion. The second conductive material portion, the node dielectric, and a portion of the at least one semiconductor layer collectively constitute a trench capacitor.

According to another aspect of the present disclosure, a method of forming a semiconductor structure is provided, which includes: forming a first trench and a second trench in a semiconductor-on-insulator (SOI) substrate including a stack, from bottom to top of, at least one semiconductor layer, a buried insulator layer, and a top semiconductor layer; covering sidewalls of the second trench in the SOI substrate with an oxygen-impermeable layer, while sidewalls of the first trench in the SOI substrate are physically exposed; and oxidizing semiconductor materials on the sidewalls of the first trench while the oxygen-impermeable layer covers the sidewalls of the second trench. A semiconductor material of the at least one semiconductor layer around the first trench is oxidized to form a bottom semiconductor oxide portion, and a semiconductor material of the top semiconductor layer around the first trench is oxidized to form a top semiconductor oxide portion. The method further includes depositing a conductive material in the first trench and the second trench.

DETAILED DESCRIPTION

Figure 1:
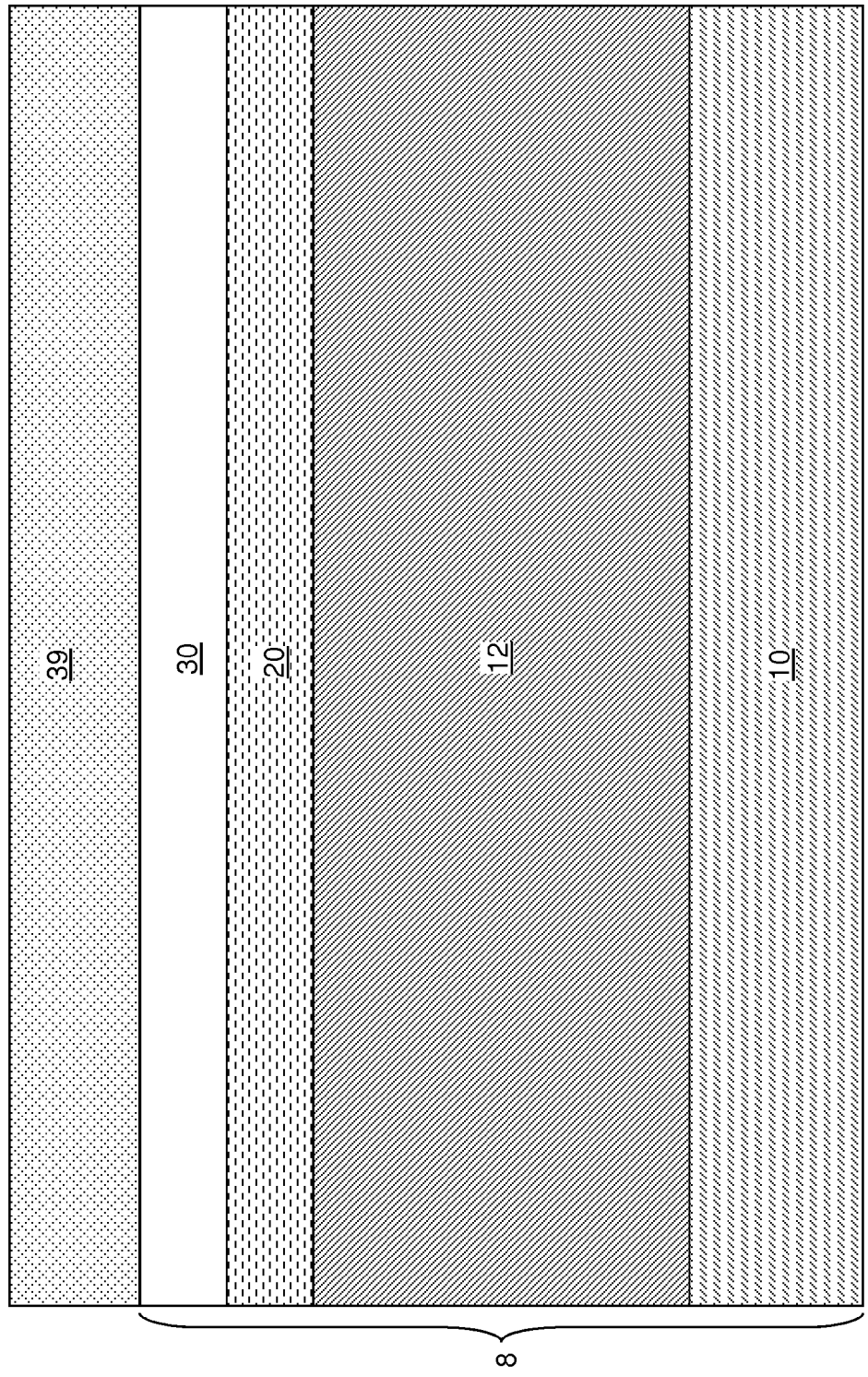
FIG. 1 is a vertical cross-sectional view of a first exemplary semiconductor structure after formation of a hard mask layer on a semiconductor-on-insulator (SOI) substrate according to a first embodiment of the present disclosure.

As stated above, the present disclosure relates to a semiconductor structure including a deep isolation trench and a deep capacitor trench on a semiconductor-on-insulator substrate and a method of manufacturing the same, which are now described in detail with accompanying figures. It is noted that like reference numerals refer to like elements across different embodiments. The drawings are not necessarily drawn to scale.

As used herein, a "deep trench" refers to a trench that extends from a topmost surface of a semiconductor-on-insulator (SOI) substrate through a top semiconductor layer and a buried insulator layer and partly into an underlying semiconductor layer. A "deep isolation trench" refers to a deep trench that electrically isolates two device components. A "deep capacitor trench" refers to a deep trench on which a capacitor is formed.

Referring to FIG. 1, a first exemplary semiconductor structure according to a first embodiment of the present disclosure includes a first substrate 2. The first substrate 2 can be a bulk substrate including a semiconductor substrate layer 10. The semiconductor substrate layer 10 includes a semiconductor material, which can be an elemental semiconductor material such as silicon or germanium, an alloy of elemental semiconductor materials such as a silicon carbon alloy or a silicon germanium alloy, a compound semiconductor material such as a III-V compound semiconductor material or a II-VI compound semiconductor material, or a combination thereof. The semiconductor substrate layer 10 can include a single crystalline semiconductor material in which the semiconductor material is aligned in a single crystalline lattice structure. For example, the semiconductor substrate layer 10 can be a single crystalline silicon layer. The thickness of the first substrate 2 can be from 50 microns to 1 mm, and typically from 600 microns to 900 microns, although lesser and greater thicknesses can also be employed.

The semiconductor substrate layer 10 can have a doping at a relatively low dopant concentration, which is herein referred to as a first dopant concentration. The first dopant concentration can be, for example, from $1.0 \times 10^{13}/cm^3$ to $1.0 \times 10^{17}/cm^3$, and typically from $1.0 \times 10^{14}/cm^3$ to $1.0 \times 10^{16}/cm^3$, although lesser and greater dopant concentrations can also be employed. The conductivity type of the semiconductor substrate layer 10 is herein referred to as a first conductivity type, which can be p-type or n-type. In one embodiment, the entirety of the semiconductor substrate layer 10 can have a uniform dopant concentration, which is the first dopant concentration.

Referring to FIG. 1, a first exemplary semiconductor structure includes a semiconductor-on-insulator (SOI) substrate 8 and an oxygen-impermeable layer 39 formed thereupon. The SOI substrate 8 includes a stack, from bottom to top, of at least one semiconductor layer, a buried insulator layer 20, and a top semiconductor layer 30.

The at least one semiconductor layer can include, for example, a stack, from bottom to top, of a first semiconductor layer 10 and a second semiconductor layer 12. The first semiconductor layer 10 and the second semiconductor layer 12 can include the same semiconductor material or different semiconductor materials. The buried insulator layer 30 includes a dielectric material such as silicon oxide, silicon nitride, a dielectric metal oxide, or a combination thereof. The top semiconductor layer 30 includes a semiconductor material, which can be the same as, or different from, the semiconductor materials of the first semiconductor layer 10 and the second semiconductor layer 12.

Each of the first semiconductor layer 10, the second semiconductor layer 12, and the top semiconductor layer 30 includes a semiconductor material independently selected from elemental semiconductor materials (e.g., silicon, germanium, carbon, or alloys thereof), III-V semiconductor materials, or II-VI semiconductor materials. Each semiconductor material for the first semiconductor layer 10, the second semiconductor layer 12, and the top semiconductor layer 30 can be independently single crystalline, polycrystalline, or amorphous. In one embodiment, the first semiconductor layer 10, the second semiconductor layer 12, and the top semiconductor layer 30 are single crystalline, and the second semiconductor layer 12 is epitaxially aligned to the first semiconductor layer 10. In one embodiment, the first semiconductor layer 10, the second semiconductor layer 12, and the top semiconductor layer 30 include single crystalline silicon.

In one embodiment, the first semiconductor layer 10 can be doped with dopants of a first conductivity type, and the second semiconductor layer 12 can be doped with dopants of a second conductivity type which is the opposite of the first conductivity type. For example, the first conductivity type can be p-type and the second conductivity type can be n-type, or vice versa. In this case, a p-n junction is formed between the first semiconductor layer 10 and the second semiconductor layer 12. Alternatively, the first semiconductor layer 10 and the second semiconductor layer 12 can have a doping of the same conductivity type and different dopant concentrations. The dopant concentration in the second semiconductor layer 12 can be, for example, from $1.0 \times 10^{18}/cm^3$ to $2.0 \times 10^{21}/cm^3$, and typically from $5.0 \times 10^{18}/cm^3$ to $5.0 \times 10^{19}/cm^3$, although lesser and greater dopant concentrations can also be employed. Yet alternatively, the stack of the first semiconductor layer 10 and the second semiconductor layer 12 can be replaced with a single semiconductor layer having a same dopant concentration throughout.

In one embodiment, the thickness of the top semiconductor layer 30 can be from 5 nm to 300 nm, the thickness of the buried insulator layer 20 can be from 50 nm to 1,000 nm, the thickness of the second semiconductor layer 12 can be from 1 micron to 10 microns, and the thickness of the first semiconductor layer 10 can be from 50 microns to 2 mm, although lesser and greater thicknesses can also be employed for each of these layers (30, 20, 12, 10).

A hard mask layer 39 is formed on the top surface of the SOI substrate, for example, by chemical vapor deposition (CVD) or atomic layer deposition (ALD). The hard mask layer 39 can include silicon nitride, a dielectric metal nitride, doped or undoped silicon oxide, or a stack thereof. The thickness of the hard mask layer 30 can be from 100 nm to 1,000 nm, although lesser and greater thicknesses can also be employed.

Figure 2A:
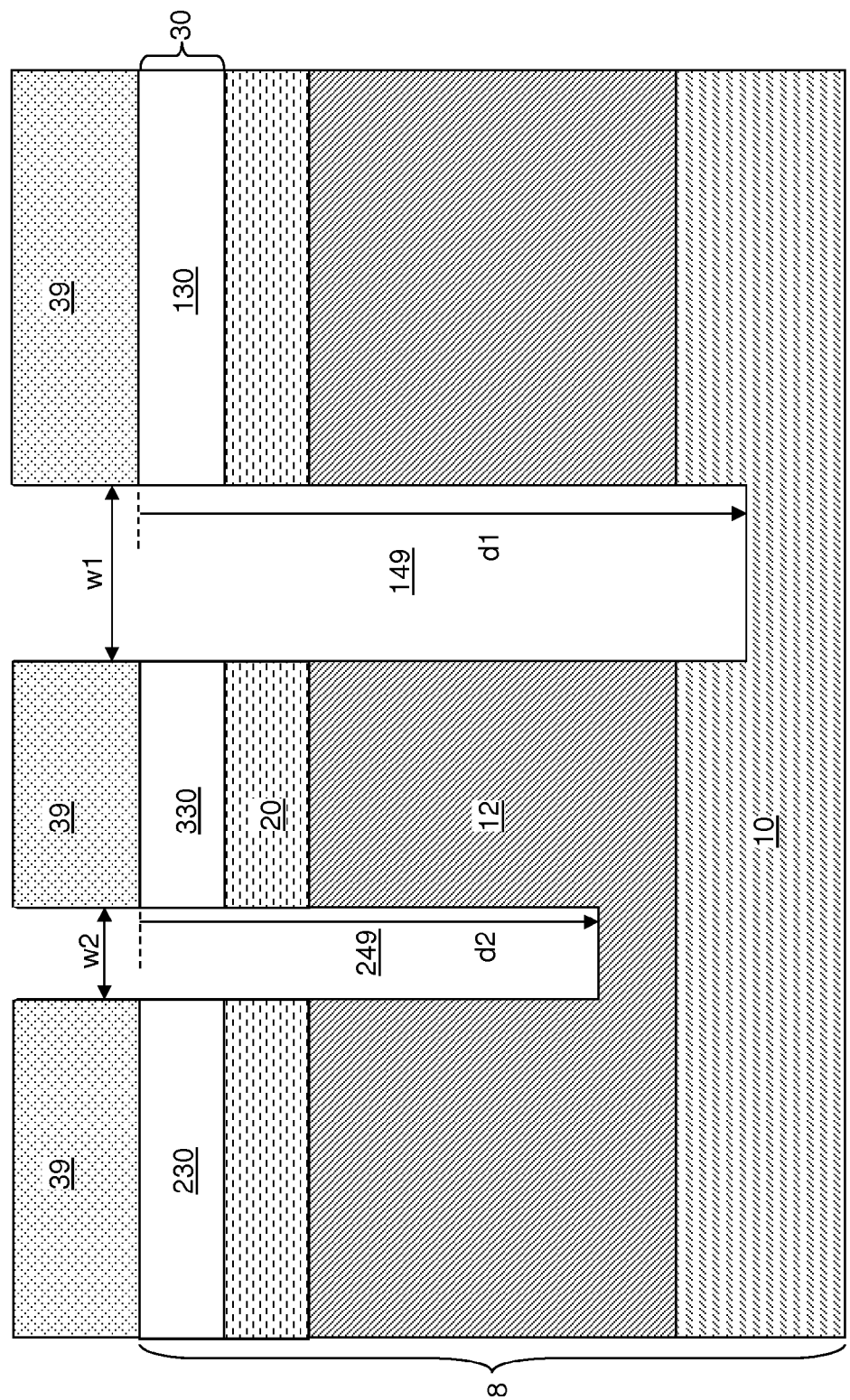
FIG. 2A is a vertical cross-sectional view of the first exemplary semiconductor structure after formation of a first deep trench and a second deep trench in the SOI substrate according to the first embodiment of the present disclosure.
Figure 2B:
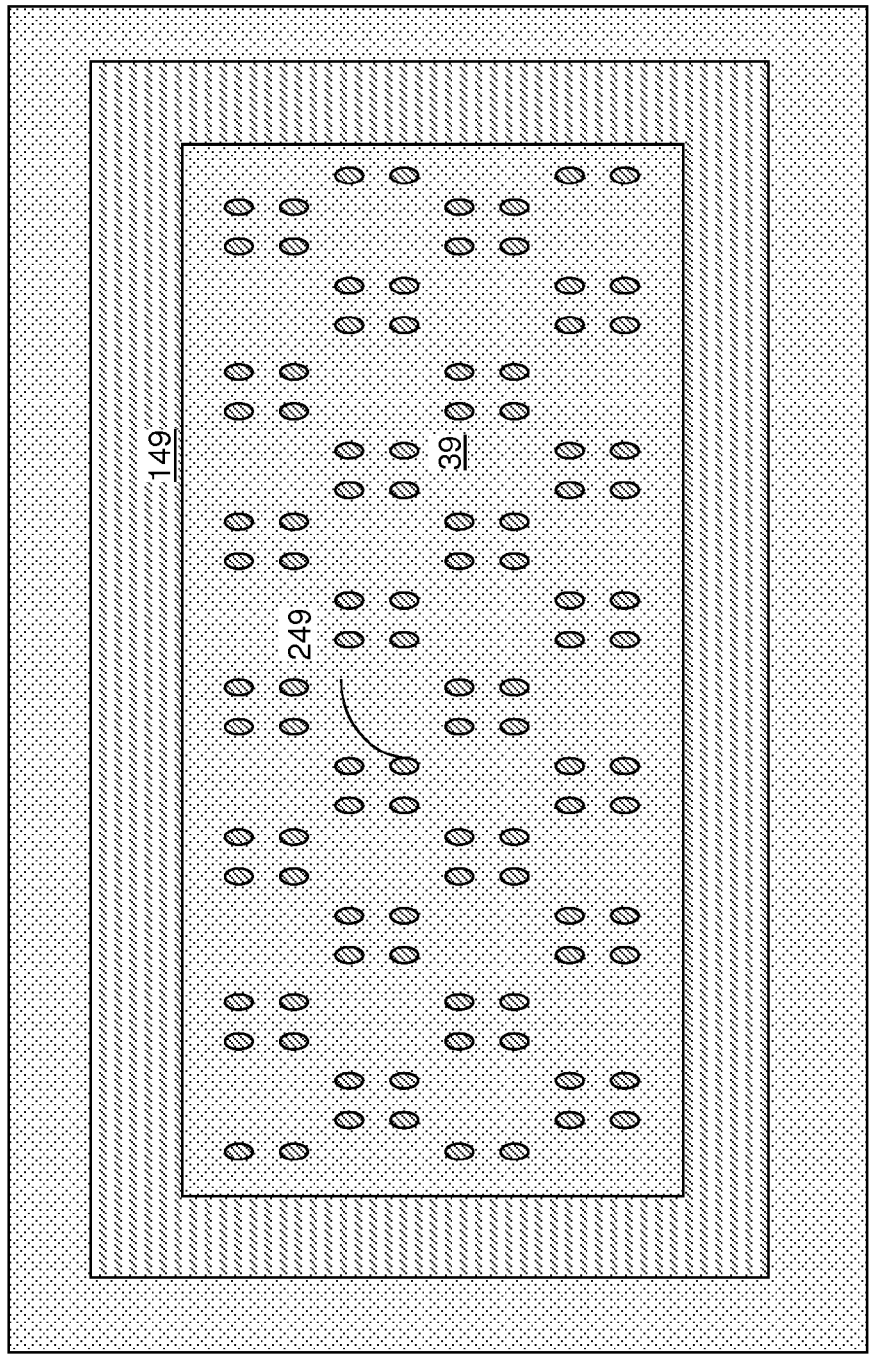
FIG. 2B is a zoom-out top-down view of the first exemplary semiconductor structure of FIG. 2A.

Referring to FIGS. 2A and 2B, the hard mask layer 39 is patterned, for example, by applying a photoresist (not shown) on the top surface of the hard mask layer 39, patterning the photoresist by lithographic exposure and development, transferring the pattern in the photoresist into the hard mask layer 39 by an anisotropic etch, and removing the photoresist by ashing.

The pattern in the hard mask layer 39 is transferred into the SOI substrate 8 by an anisotropic etch that employs the patterned hard mask layer 39 as an etch mask. The openings in the hard mask layer 39 include a first opening having a first width w1 and at least one second opening having a second width w2. The first width w1 is greater than the second width w2. In one embodiment, the first width w1 can be greater than 150% of the second width w2. In another embodiment, the first width w1 can be at least three times the second width w2. In an illustrative example, the first width w1 can be about 60 nm, and the second width w2 can be about 200 nm.

The patterning of the opening having the first width w1 in the hard mask layer 39 is transferred into the SOI substrate 8 to simultaneously form a first trench 149 having a first depth d1 as measured from the top surface of the SOI substrate 8, and at least one second trench 249 having a second depth d2 as measured from the top surface of the SOI substrate 8. The difference between the first depth d1 and the second depth d2 is caused by a loading effect associated with anisotropic etch. Specifically, the loading effect causes trenches in a less dense array or isolated trenches to be etched deeper than trenches in a dense array. Further, etchant gas has easier access to the bottom of a wider trench than to the bottom of a narrow trench, thereby etching wider trenched to a deeper depth than the narrow trench.

The first trench 124 and each second trench 249 extend through the top semiconductor layer 30, the buried insulator layer 20, and at least an upper portion of the second semiconductor layer 12. In one embodiment, the first depth d1 and the second depth d2 are selected such that the first trench 149 extends through the second semiconductor layer 12 and into an upper portion of the first semiconductor layer 10, and the bottom surface of each second trench 249 is within the second semiconductor layer 12.

Each second trench 249 can be configured for formation of a deep capacitor trench, i.e., can be formed as isolated trench structures having a horizontal cross-sectional area of a circle, an ellipse, a superellipse, or a polygon. In one embodiment, the first trench 149 can be formed as a moat trench that laterally encloses a device region. Semiconductor devices formed on, or in, the portion of the top semiconductor layer 30 within that device region are electrically isolated from other semiconductor devices formed outside the moat trench.

The top semiconductor layer 130 can be divided into various semiconductor portions, which can include, for example, a first top semiconductor portion 130, a second top semiconductor portion 230, and a third top semiconductor portion 330.

Figure 3:
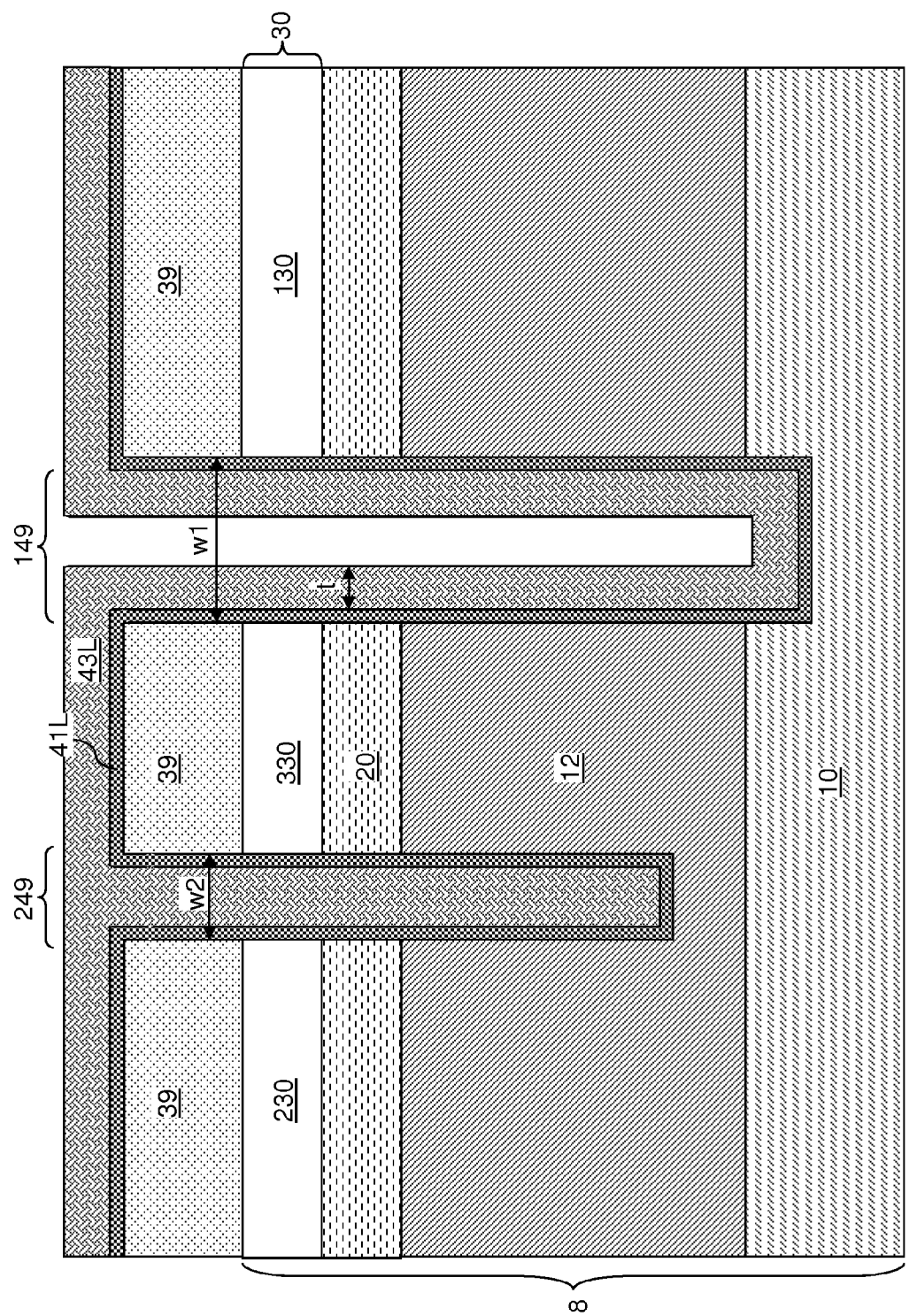
FIG. 3 is a vertical cross-sectional view of the first exemplary structure after formation of an oxygen-impermeable layer and a fill material layer according to the first embodiment of the present disclosure.

Referring to FIG. 3, a contiguous oxygen-impermeable layer 41L and a fill material layer are sequentially deposited on the sidewalls and bottom surfaces of the first trench 149 and the at least one second trench 249. As used herein, an "oxygen-impermeable" element refers to an element through which oxygen is not permeable. In other words, the contiguous oxygen-impermeable layer 41L includes a material that is not permeable to oxygen. The contiguous oxygen-impermeable layer 41L can include, for example, silicon nitride or a dielectric metallic nitride. The contiguous oxygen-impermeable layer 41L is formed as a single contiguous layer that contacts sidewall surfaces and bottom surfaces of the first trench 149 and the at least one second trench 249 and the top surface and sidewall surfaces of the hard mask layer 39 without any hole therein.

The fill material layer 43L includes a material that can be removed selective to the materials of the contiguous oxygen-impermeable layer 41L and the hard mask layer 39 in an anisotropic etch, or a material that can be removed selective to the materials of the contiguous oxygen-impermeable layer 41L, the hard mask layer 39, the buried insulator layer 20, and the semiconductor materials of the first semiconductor layer 10, the second semiconductor layer 12, and the top semiconductor layer 30 in an isotropic etch. For example, the fill material layer 43L can include, for example, silicon, germanium, carbon, a compound semiconductor material, or an alloy thereof. In one embodiment, the fill material layer 43L includes amorphous carbon, amorphous or polycrystalline germanium, amorphous or polycrystalline silicon germanium alloy, or amorphous or polycrystalline silicon.

The contiguous oxygen-impermeable layer 41L and the fill material layer 43L are deposited conformally, for example, by chemical vapor deposition (CVD) or atomic layer deposition (ALD). The thickness of the oxygen-impermeable layer 41L can be from 4 nm to 40 nm, although lesser and greater thicknesses can also be employed. The sum of the thickness of the contiguous oxygen-impermeable layer 41L and the thickness of the fill material layer 43L is greater than the one half of the second width w2, and is less than one half of the first width w1. Thus, a cavity is present within the first trench 149 after deposition of the contiguous oxygen-impermeable layer 41L and the fill material layer 43L, and each of the at least one second cavity 249 is completely filled with the contiguous oxygen-impermeable layer 41L and the fill material layer 43L.

Figure 4:
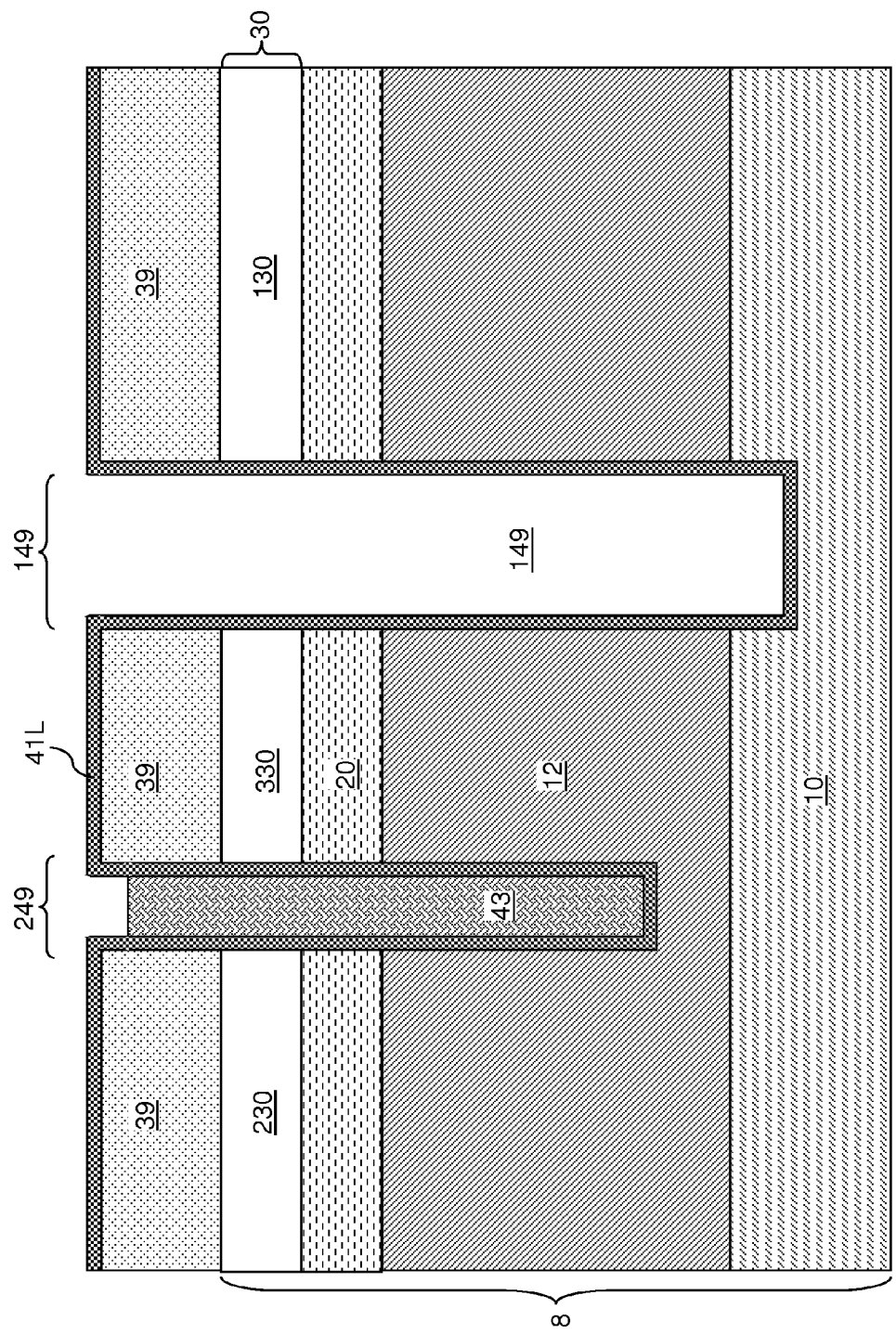
FIG. 4 is a vertical cross-sectional view of the first exemplary semiconductor structure after removal of the fill material layer from inside the first deep trench according to the first embodiment of the present disclosure.

Referring to FIG. 4, the fill material layer 43L is isotropically etched, for example, by a wet etch or an isotropic dry etch. The portions of the fill material layer 43L on the sidewalls of the oxygen-impermeable layer 41L within the first trench 149 is laterally etched by the isotropic etch. Thus, the fill material layer 43L is completely removed from inside the first trench 149.

Because the fill material layer 43L completely fills the inside of each second trench 249, the etching of the portion of the fill material layer 43L within the at least one second trench 249 proceed vertically. The isotropic etch is terminated when a remaining portion of the fill material layer 43L, which is herein referred to as a fill material portion 43, is recessed to a depth between the top surface of the hard mask layer 39 and the bottom surface of the hard mask layer 39. Thus, the top surface of the fill material portion 43 is located above the level of the topmost surface of the SOI substrate 8.

Figure 5:
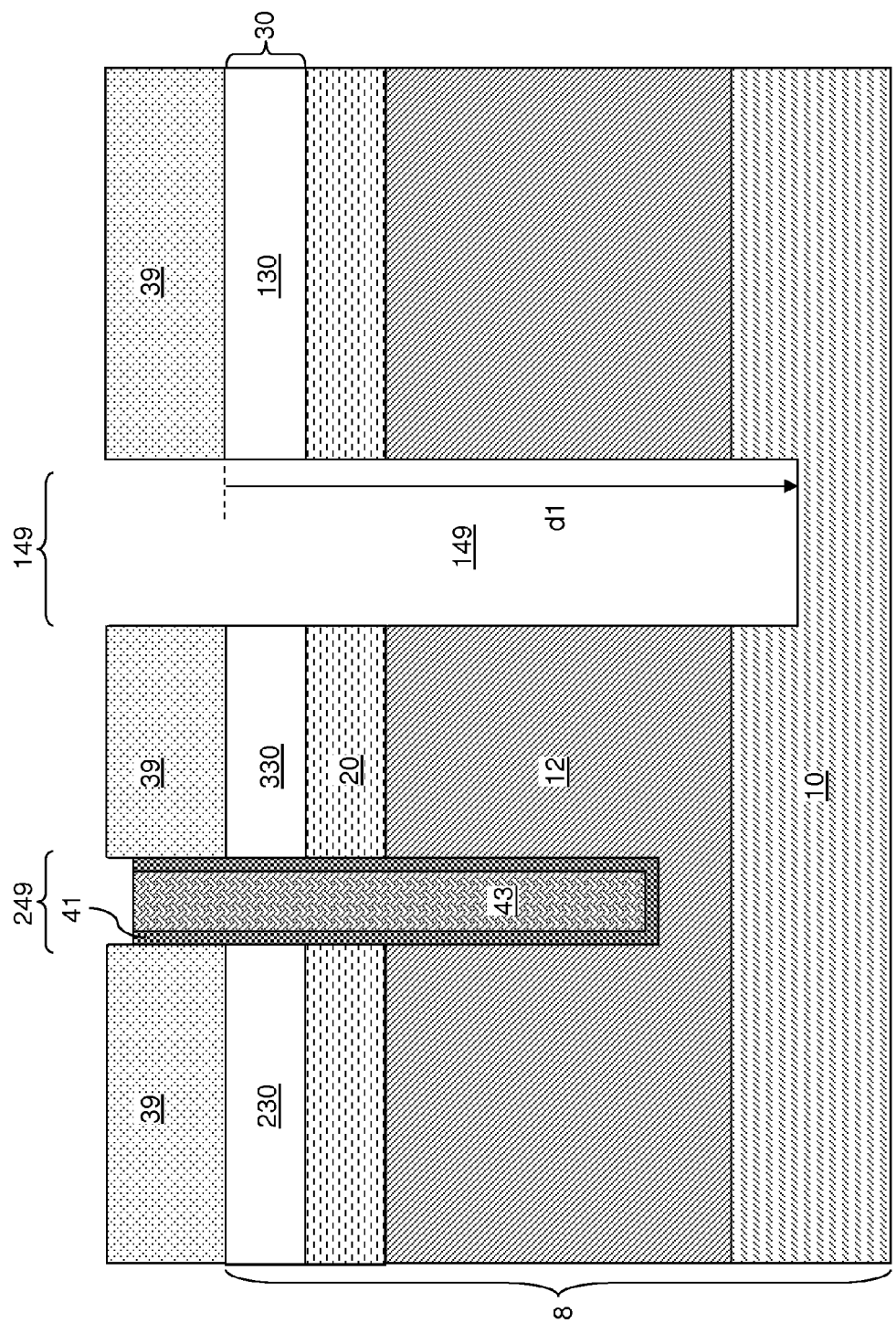
FIG. 5 is a vertical cross-sectional view of the first exemplary semiconductor structure after removal of the oxygen-impermeable layer from inside the first deep trench according to the first embodiment of the present disclosure.

Referring to FIG. 5, physically exposed portions of the contiguous oxygen-impermeable layer 41L is removed, for example, by a wet etch. A remaining portion of the contiguous oxygen-impermeable layer 41L that contiguously surrounds a fill material portion 43 is herein referred to as an oxygen-impermeable layer 41. If the at least one second trench 249 is a plurality of deep trenches, a plurality of oxygen-impermeable layers 41L are formed in the first exemplary structure. A topmost portion of each oxygen-impermeable layer 41L is located above the level of the topmost surface of the SOI substrate 8.

Figure 6:
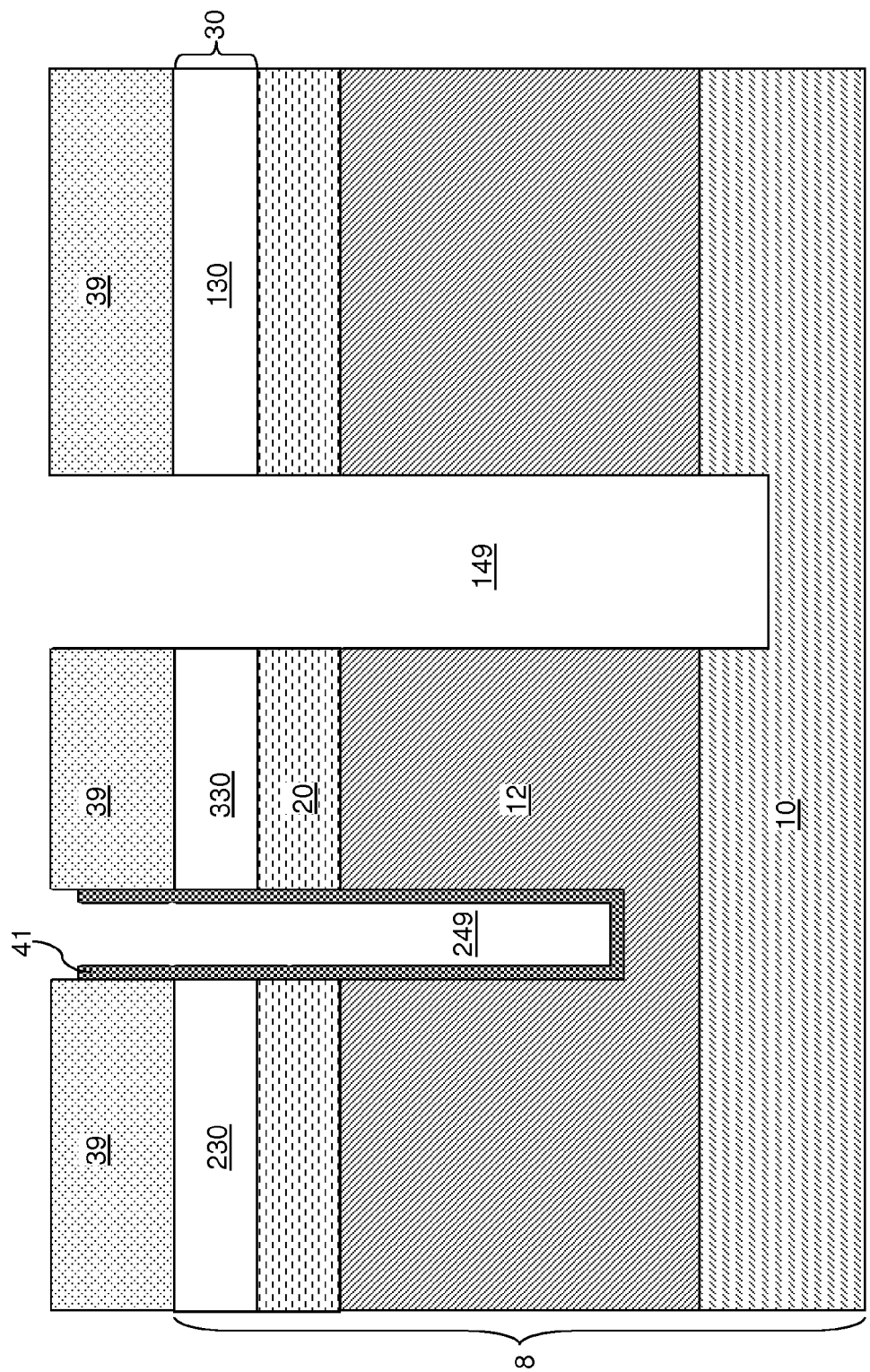
FIG. 6 is a vertical cross-sectional view of a variation of the first exemplary semiconductor structure after removal of a fill material portion according to the first embodiment of the present disclosure.

Referring to FIG. 6, each fill material portion 43 is removed by an anisotropic etch or an isotropic etch. In one embodiment, an anisotropic etch, e.g., a reactive ion etch, is performed to remove each fill material portion 43 selective to the materials of the contiguous oxygen-impermeable layer 41L and the hard mask layer 39 in an anisotropic etch. In this case, the first depth d1 of the first trench 149 can be increases relative to the original value for the first depth d1 at the processing step of FIGS. 2A and 2B.

In another embodiment, an isotropic etch can be performed to remove each fill material portion selective to the materials of the contiguous oxygen-impermeable layer 41L, the hard mask layer 39, the buried insulator layer 20, and the semiconductor materials of the first semiconductor layer 10, the second semiconductor layer 12, and the top semiconductor layer 30 in an isotropic etch. For example, if the at least one fill material portion 43 includes germanium, the first semiconductor layer 10, the second semiconductor layer 12, and the top semiconductor layer 30 include silicon, the buried insulator layer 20 includes silicon oxide, and the hard mask layer 39 includes silicon oxide, a wet etch employing hydrogen peroxide can remove the at least one fill material portion 43 selective to other materials in the first exemplary structure.

At the end of the processing step of FIG. 6, sidewalls of the at least one second trench 249 in the SOI substrate 8 are covered with the oxygen-impermeable layer 41, while sidewalls of the first trench 149 in the SOI substrate 8 are physically exposed.

Figure 7:
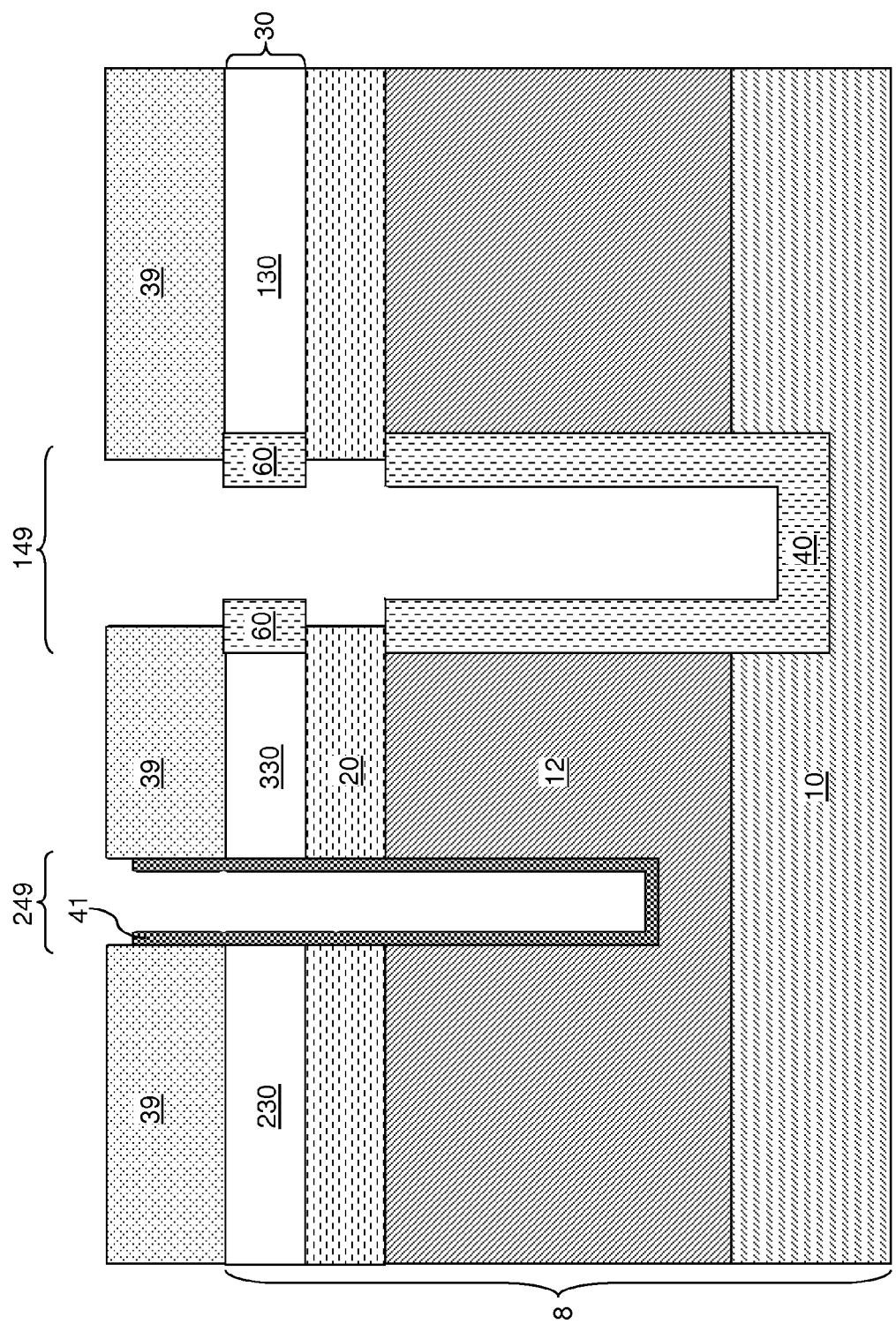
FIG. 7 is a vertical cross-sectional view of the variation of the first exemplary semiconductor structure after oxidation of semiconductor materials around the first deep trench according to the first embodiment of the present disclosure.

Referring to FIG. 7, thermal oxidation process is performed to convert the semiconductor materials around the first trench 149 into oxides of semiconductor materials, while the oxygen-impermeable layer 41 covers the sidewalls of the at least one second trench 249 and prevents oxidation of the semiconductor materials around the at least one second trench 249. At least one semiconductor material of the at least one semiconductor layer (10, 20) around the first trench 149 is oxidized around the first trench 149 to form a bottom semiconductor oxide portion 40. For example, surface portions of the semiconductor material of the first semiconductor layer 10 and surface portions of the semiconductor material of the second semiconductor layer 20 around the first trench 149 are oxidized to form the bottom semiconductor oxide portion 40. The semiconductor material of the top semiconductor layer around the first trench 149 is oxidized to form a top semiconductor oxide portion 60.

In one embodiment, if the composition of the semiconductor material in the top semiconductor layer 30 is homogeneous, thermal oxidation of the semiconductor material of the top semiconductor layer 30 can proceed laterally at the same rate irrespective of the depth within the first trench 149, and the thickness of the top semiconductor oxide portion 60 can be vertically invariant. In one embodiment, if the composition of the semiconductor material in the second semiconductor layer 12 is homogeneous, thermal oxidation of the semiconductor material of the second semiconductor layer 12 can proceed laterally at the same rate irrespective of the depth within the first trench 149, and the thickness of an upper portion of the bottom semiconductor oxide portion 40 can be vertically invariant. In one embodiment, if the composition of the semiconductor material in the first semiconductor layer 10 is homogeneous, thermal oxidation of the semiconductor material of the first semiconductor layer 10 can proceed laterally at the same rate irrespective of the depth within the first trench 149, and the thickness of a bottom portion of the bottom semiconductor oxide portion 40 can be vertically invariant. The first trench 149 expands laterally and vertically during the thermal conversion of the semiconductor materials into thermal oxides of semiconductor materials. The thicknesses of the top semiconductor oxide portion 60 and the bottom semiconductor oxide portion 40 can be in a range from 10 nm to 200 nm, although lesser and greater thicknesses can also be employed.

The bottom semiconductor oxide portion 40 is located in the first trench 149 and underneath the bottom surface of the buried insulator layer 40, and includes an oxide of a semiconductor material of at least one semiconductor layer (10, 12) located underneath the buried insulator layer 20. The top semiconductor oxide portion 60 is located in the first trench 149 and above the top surface of the buried insulator layer 20, and includes an oxide of the semiconductor material of the top semiconductor layer 30 located above the buried insulator layer 20. The top semiconductor oxide portion 60 is vertically spaced from the bottom semiconductor oxide portion 40 by the thickness of the buried insulator layer 20.

In one embodiment, the first semiconductor layer 10, the second semiconductor layer 12, and the top semiconductor layer 30 are single crystalline silicon layers having different types of doping and/or dopant concentration, and the bottom semiconductor oxide portion 40 and the top semiconductor oxide portion 60 include thermal silicon oxide.

If the first trench is a moat trench, the top semiconductor oxide portion 60 can be formed as two physically disjoined, i.e., non-contacting, structures that include an inner top semiconductor oxide portion located on inner sidewalls of the moat trench and topologically homeomorphic to a torus, and an outer top semiconductor oxide portion located on outer sidewalls of the moat trench and topologically homeomorphic to a torus.

Figure 8:
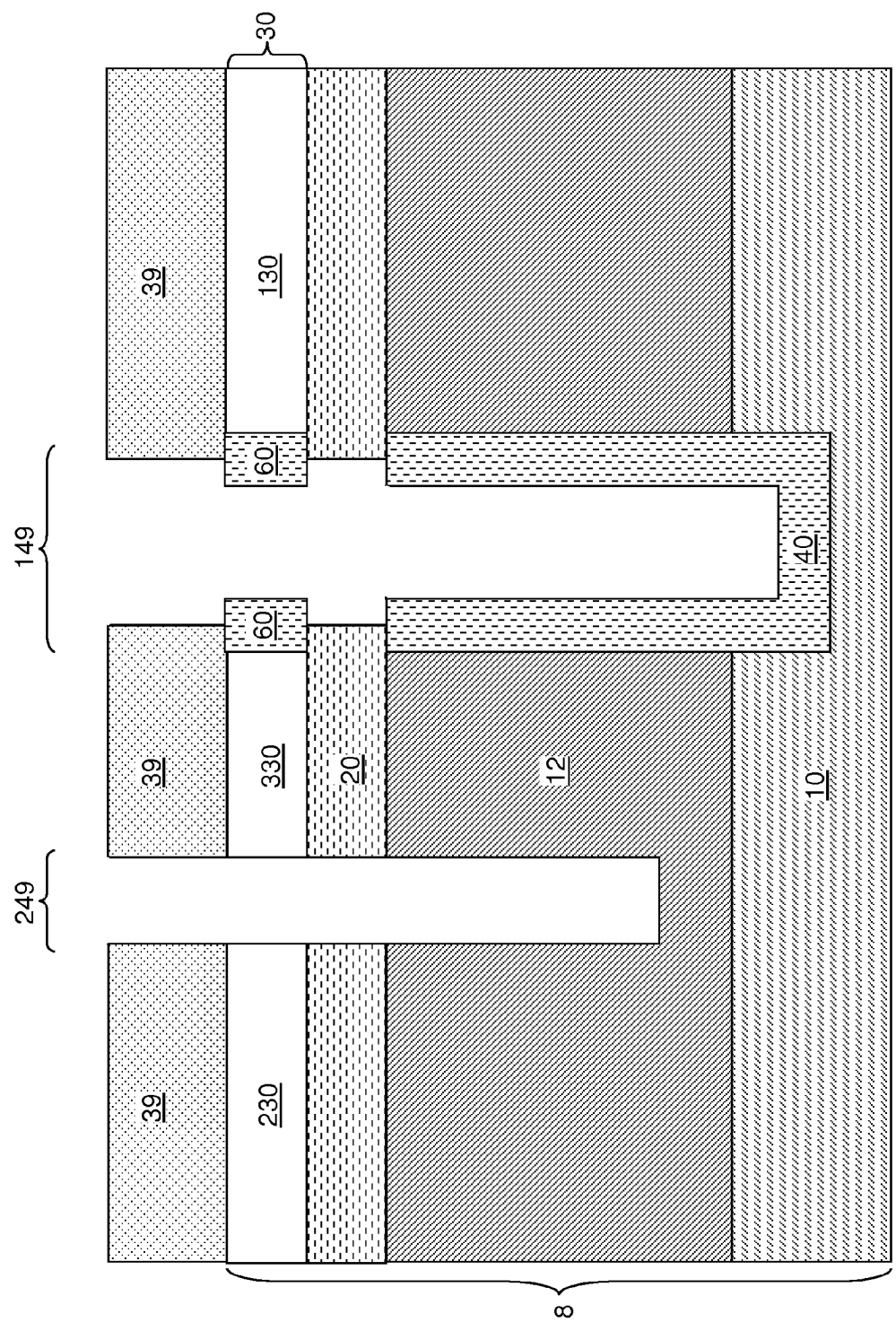
FIG. 8 is a vertical cross-sectional view of the first exemplary semiconductor structure after optional removal of the oxygen-impermeable layer from inside the second deep trench according to the first embodiment of the present disclosure.

Referring to FIG. 8, the oxygen-impermeable layer(s) 41 can be optionally removed from inside each second trench 249, for example, by a wet etch. For example, if the oxygen-impermeable layer(s) 41 include(s) silicon nitride, a hot phosphoric acid wet etch can be employed to remove the oxygen-impermeable layer(s) 41 selective to the top semiconductor oxide portion 60 and the bottom semiconductor oxide portion 40.

Figure 9:
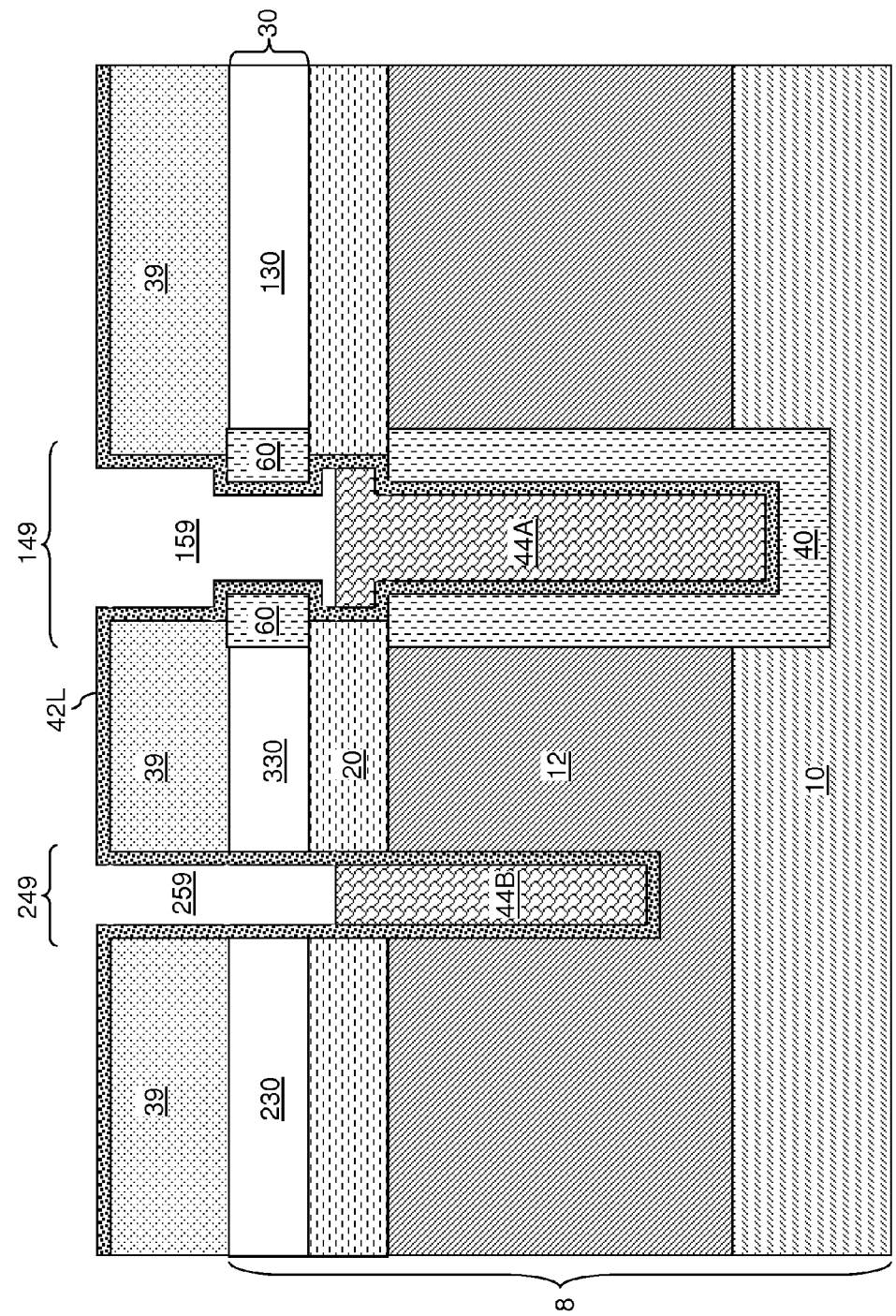
FIG. 9 is a vertical cross-sectional view of the first exemplary semiconductor structure after formation of a contiguous node dielectric layer and conductive fill portions according to the first embodiment of the present disclosure.

Referring to FIG. 9, a contiguous node dielectric layer 42L is deposited conformally on all physically exposed sidewalls in the first trench 149 and the at least one second trench 249 and the top surface and sidewalls of the hard mask layer 39 and without any hole therein. The contiguous node dielectric layer 42L can include any dielectric material that can be employed as a node dielectric material in a capacitor known in the art. For example, the contiguous node dielectric layer 42L can include at least one of silicon nitride and a dielectric metal oxide material such as high dielectric constant (high-k) gate dielectric material as known in the art.

A conductive material layer is deposited to completely fill the first trench 149 and the at least one second trench 249, and is vertically recessed to a level between the top surface of the buried insulator layer 20 and the bottom surface of the buried insulator layer 20 by a recess etch. The conductive material layer includes a conductive material, which can be a metallic material or a doped semiconductor material. The metallic material can be an elemental metal such as W, Ti, Ta, Cu, or Al, or an ally of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The conductive material layer can be deposited by physical vapor deposition (PVD), chemical vapor deposition (CVD), electroplating, electroless plating, or a combination thereof. The conductive material layer is deposited to a thickness that is sufficient to completely fill the first trench 149 and the at least one second trench 249. The recess etch of the conductive material layer can employ an anisotropic etch such as a reactive ion etch, an isotropic etch such as a wet etch, or a combination thereof.

A first conductive material portion 44A including the conductive material of the conductive material layer is formed in the first trench 149. A second conductive material portion 44B including the conductive material is formed in each of the at least one second trench 44B. Topmost surfaces of the first conductive material portion 44A and the second conductive material portion 44B are substantially planar, and are located between the level of the top surface of the buried insulator layer 20 and the level of the bottom surface of the buried insulator layer 20. A surface is substantially planar if the planarity of the surface is limited by microscopic variations in surface height that accompanies semiconductor processing steps known in the art. A first recess region 159 is formed above the first conducive material portion 44A, and a second recess region 259 is formed above each second conductive material portion 44B.

In one embodiment, inner sidewalls of the bottom semiconductor oxide portion 40 and the top semiconductor oxide portion 60 can protrude inward relative to the sidewalls of the buried insulator layer 20 within the first trench 149. In this case, the contiguous node dielectric layer 42L can be formed over the inward-protruding portions of the bottom semiconductor oxide portion 40, and over and under the inward-protruding portions of the top semiconductor oxide portion 60. In this case, an upper portion of the first conductive material portion 44A can overlie the bottom semiconductor oxide portion 40.

Figure 10:
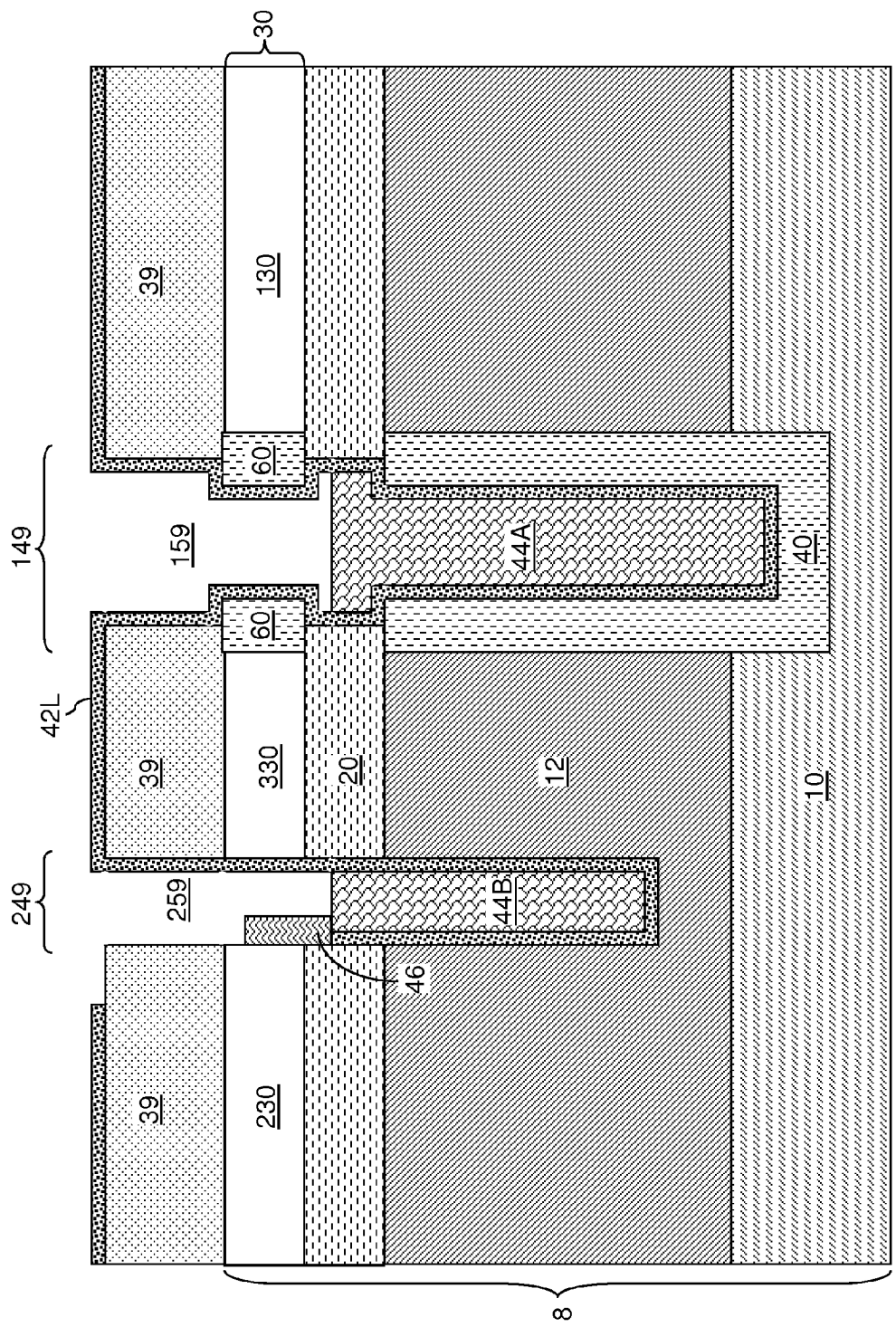
FIG. 10 is a vertical cross-sectional view of the first exemplary semiconductor structure after formation of a buried strap structure according to the first embodiment of the present disclosure.

Referring to FIG. 10, the contiguous node dielectric layer 42L can be patterned, by a combination of lithographic methods and an etch, to form an opening on a sidewall of a top semiconductor portion, which is represented by the second top semiconductor portion 230, within each second trench 230. A selective deposition of a semiconductor material or metallization of physically exposed surfaces of semiconductor materials can be performed to form a buried strap structure 46. Parameters for the process for formation of the buried strap structure 46, e.g., the thickness of a selectively deposited semiconductor material or the thickness of a metal-semiconductor alloy formed by metallization, are selected such that the buried strap structure 46 provides an electrically conductive path between each pair of the second conductive material portion 44B and the second top semiconductor portion 230 in, or on, each second trench 249.

Figure 11:
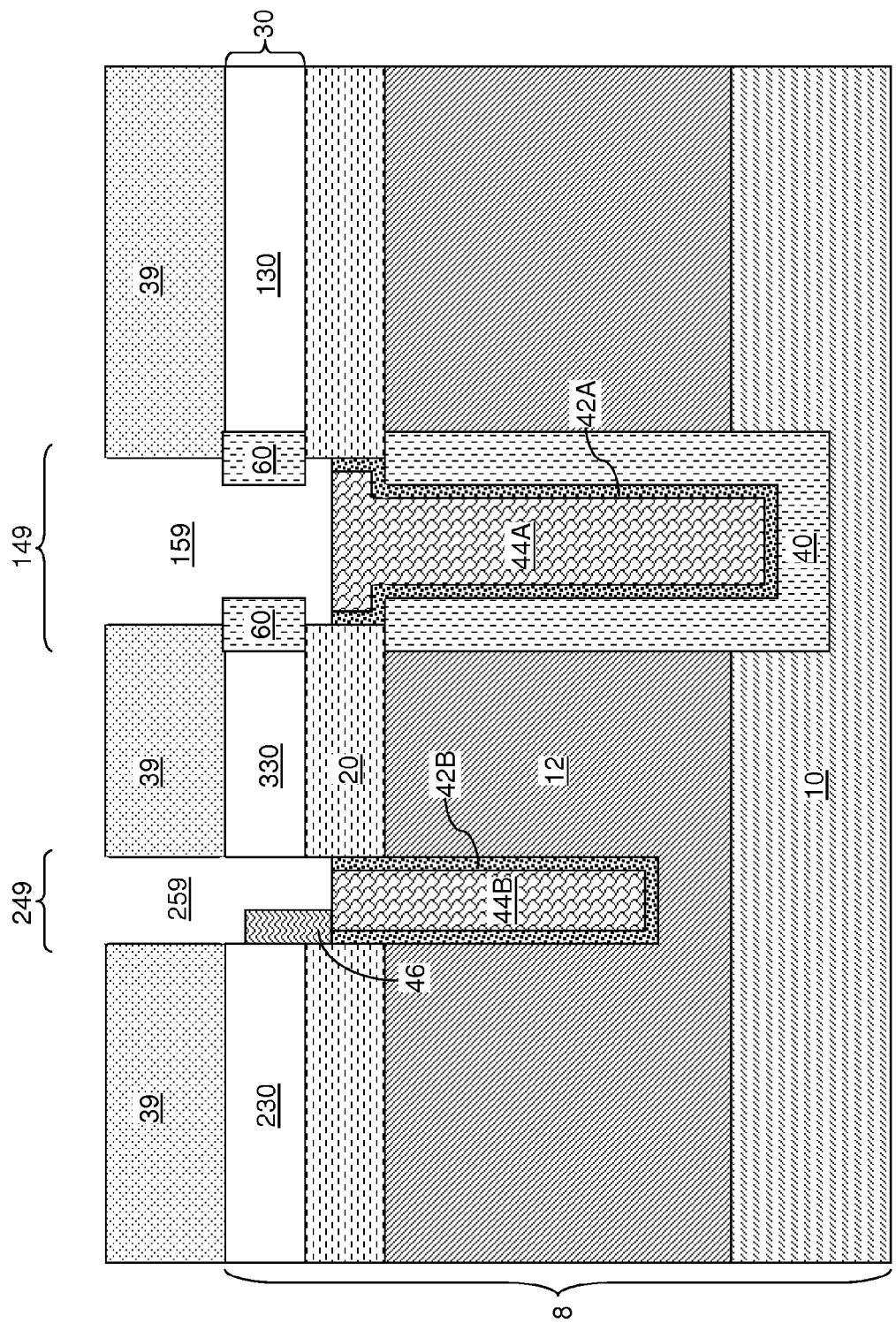
FIG. 11 is a vertical cross-sectional view of the first exemplary semiconductor structure after removal of physically exposed portions of the contiguous node dielectric layer according to the first embodiment of the present disclosure.

Referring to FIG. 11, physically exposed portions of the contiguous node dielectric layer 42L is removed, for example, by a wet etch. The remaining portion of the contiguous node dielectric layer 42L within the first trench 149 is herein referred to as a dielectric material liner 42A. The dielectric material liner 42A is in contact with sidewalls and a bottom surface of the first conductive material portion 44A, and is in contact with inner sidewalls of the bottom semiconductor oxide portion 40.

The remaining portion of the contiguous node dielectric layer 42L within each second trench 249 is herein referred to as a node dielectric layer 42B. The second conductive material portion 44B is embedded within the node dielectric layer 42B. The first conductive material portion 44A can include the same material as the second conductive material portion 44B, and the dielectric material liner 42A includes the same material as the node dielectric layer 42B. Each buried strap structure 46 is located within a second trench 249 and overlies a portion of the node dielectric layer 42B and a portion of the second conductive material portion 44B.

In one embodiment, the second semiconductor layer 12 includes a doped semiconductor material. Each node dielectric layer 42B can function as a node dielectric of a deep trench capacitor. Thus, each set of a second conductive material portion 44B in a second trench 249, a node dielectric layer 42B located in the same second trench 249, and a portion of the at least one semiconductor layer (10, 12), e.g., the portion of the second semiconductor layer 12 that embeds that second trench 249, can collectively constitute a deep trench capacitor.

Figure 12:
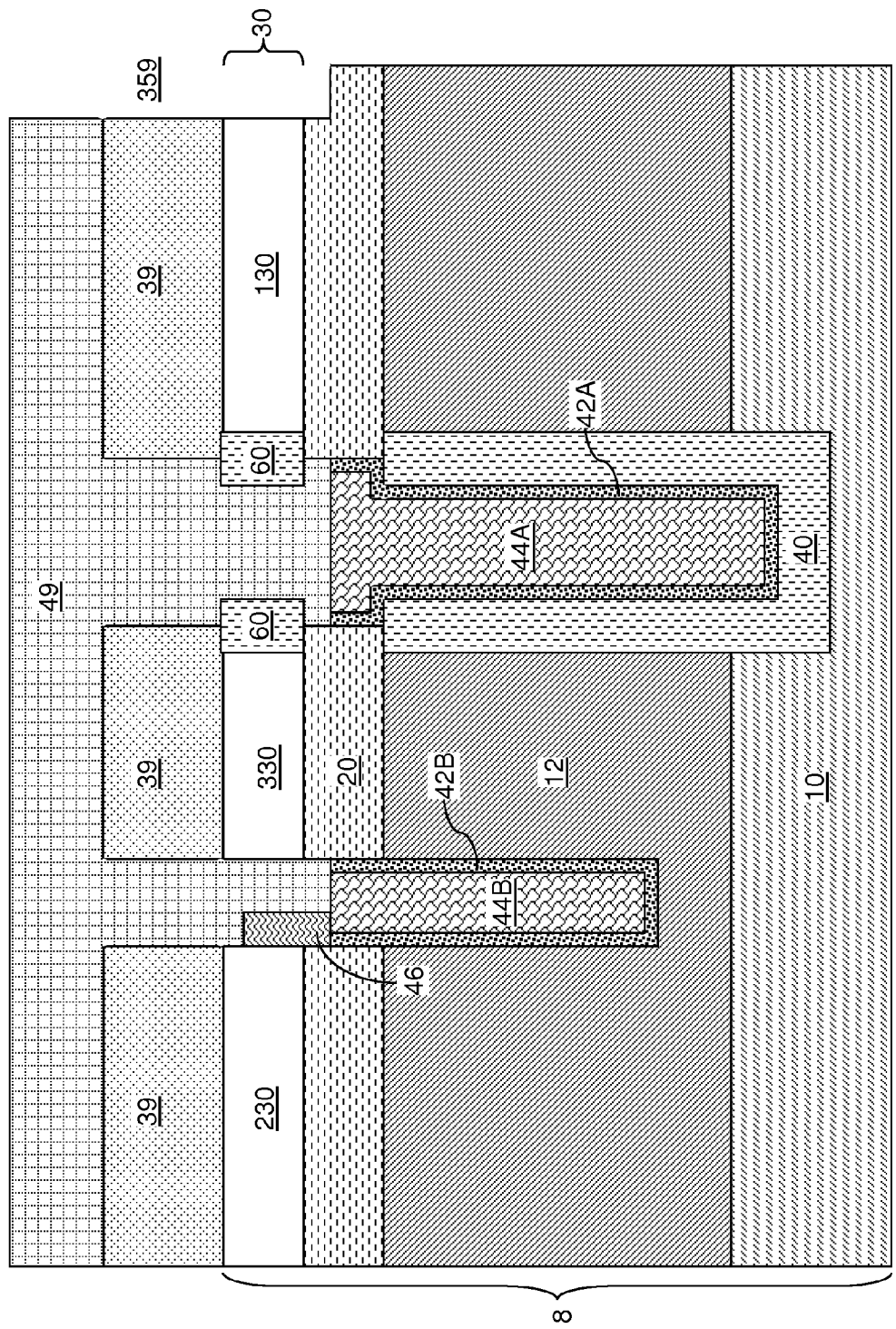
FIG. 12 is a vertical cross-sectional view of the first exemplary structure after formation of a shallow trench according to the first embodiment of the present disclosure.

Referring to FIG. 12, a photoresist 49 can be optionally applied over the first exemplary semiconductor structure, and lithographically exposed and developed to form a pattern for at least one shallow trench. The pattern in the photoresist 49 can be transferred through the hard mask layer 39 and the top semiconductor layer 30, and optionally into an upper portion of the buried insulator layer 20 to form at least one shallow trench 359.

Figure 13:
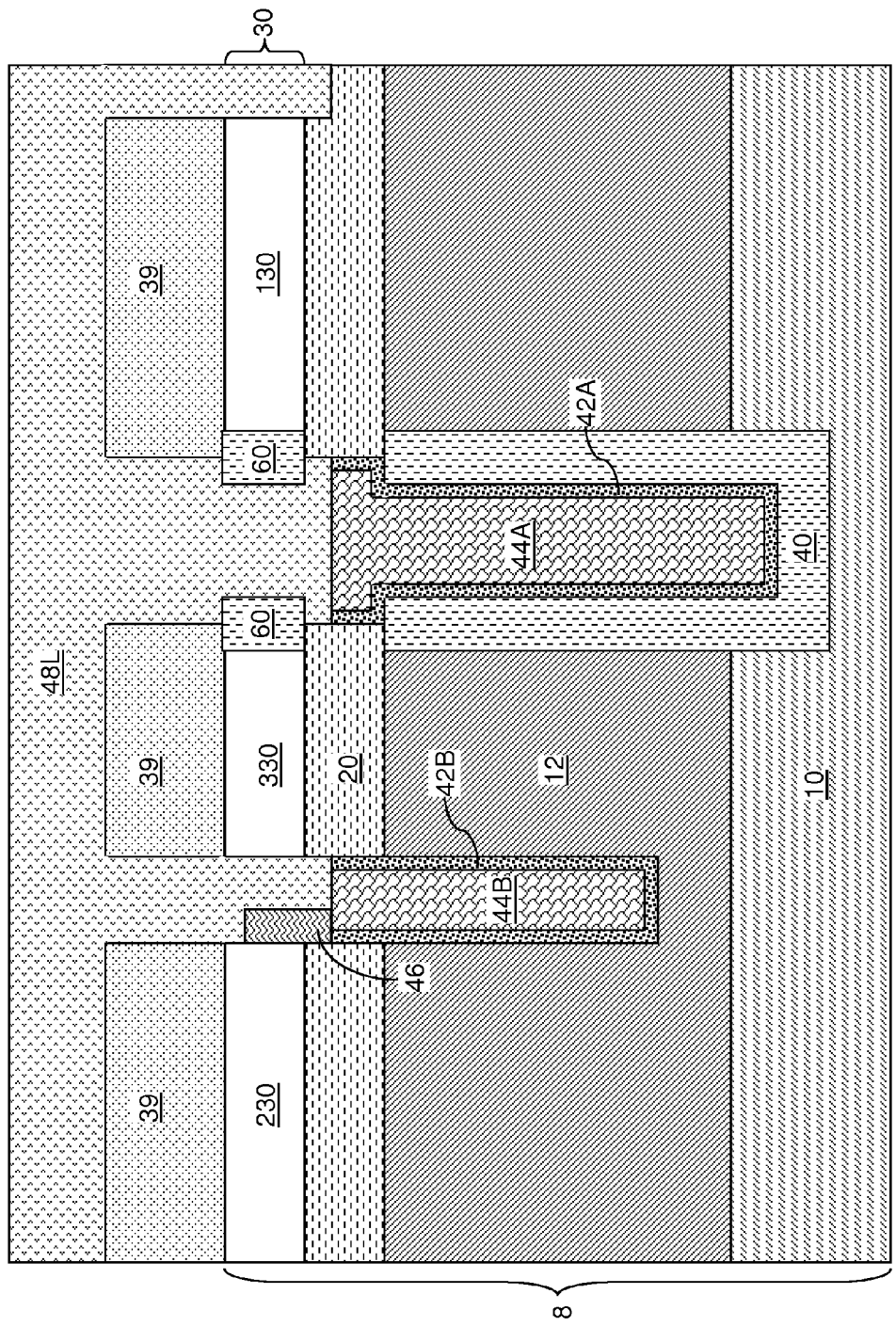
FIG. 13 is a vertical cross-sectional view of the first exemplary semiconductor structure after deposition of a dielectric fill material layer according to the first embodiment of the present disclosure.

Referring to FIG. 13, the photoresist 49 is removed, for example, by ashing. A dielectric fill material layer 48L is subsequently deposited to form a first recessed region 159, at least one second recessed region 259, and the at least one shallow trench 359. The dielectric fill material layer 48L includes a dielectric material such as silicon oxide, silicon oxynitride, or silicon nitride.

Figure 14:
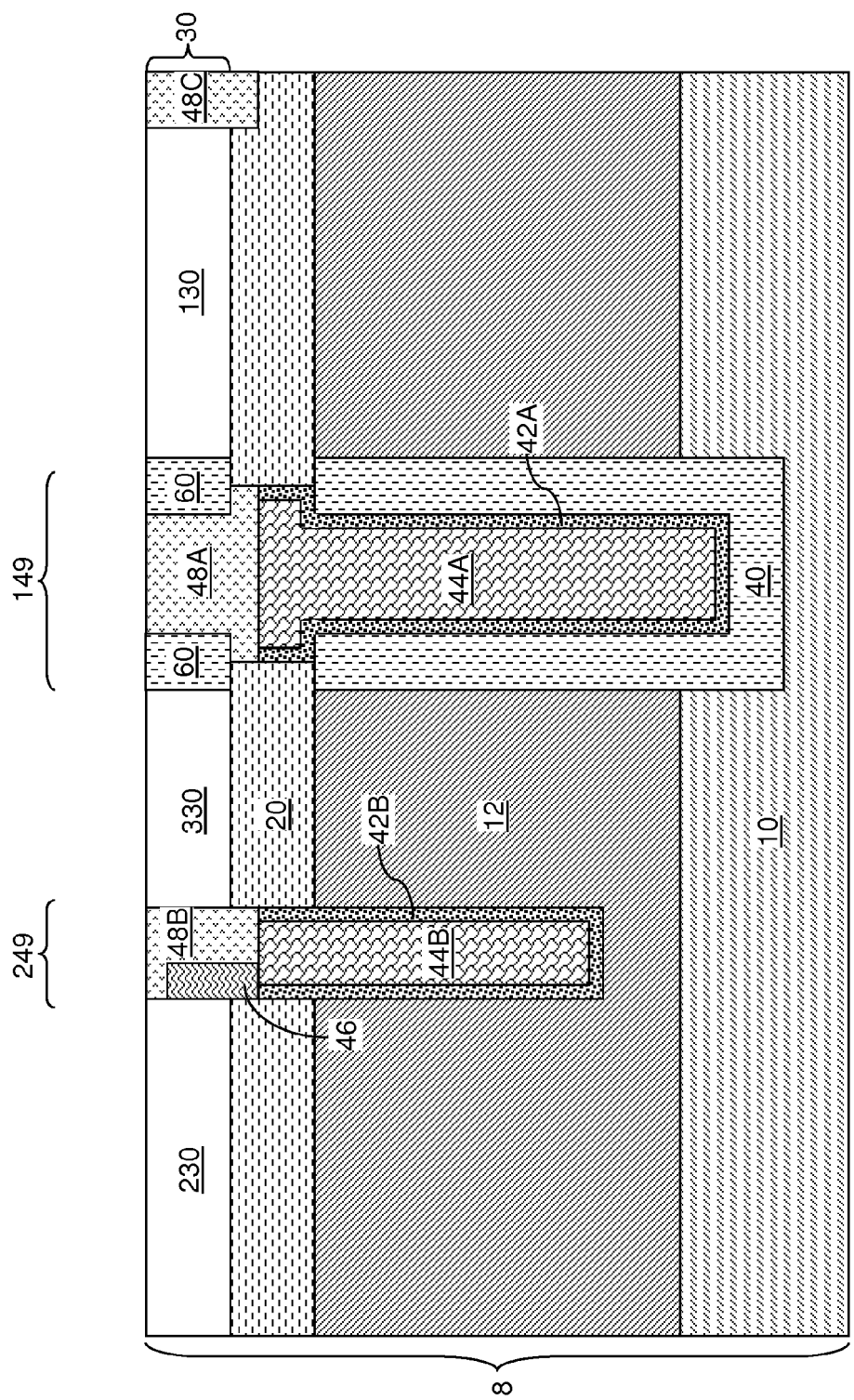
FIG. 14 is a vertical cross-sectional view of the first exemplary semiconductor structure after formation of various shallow trench isolation structures according to the first embodiment of the present disclosure.

Referring to FIG. 14, the dielectric fill material layer 48L can be recessed, for example, by a recess etch. The hard mask layer 39 is removed, for example, by a wet etch that removes the material of the hard mask layer 39 selective to the semiconductor material of the top semiconductor layer 30. A remaining portion of the dielectric fill material layer 48L overlying the first conductive material portion 44A is herein referred to as a first shallow trench isolation structure 48A. A remaining portion of the dielectric fill material layer 48L overlying each second conductive material portion 44B is herein referred to as a second shallow trench isolation structure 48B. A remaining portion of the dielectric fill material layer 48L filling a shallow trench 359 (See FIG. 12) is herein referred to as a third shallow trench isolation structure 48C. The recess depth during the recess etch of the dielectric fill material layer 48L can be selected such that the top surfaces of the first, second, and third shallow trench isolation structures (48A, 48B, 48C) is substantially coplanar with the top surface of the top semiconductor layer 30 after the recess etch and any collateral etch accompanying the removal of the hard mask layer 39.

In one embodiment, the entire periphery of the bottom surface of the first shallow trench isolation structure 48A can coincides with the entire periphery of the top surface of the first conductive material portion 44A. Each second shallow trench isolation structure 48B can be located within the second trench 249, and can overlie a portion of the node dielectric layer 42B within the second trench 249 and a portion of the second conductive material portion 44B within the second trench 249. A buried strap structure 46 is located within each second trench 249 and overlies another portion of the node dielectric layer 42B and another portion of the second conductive material portion 44B.

Figure 15:
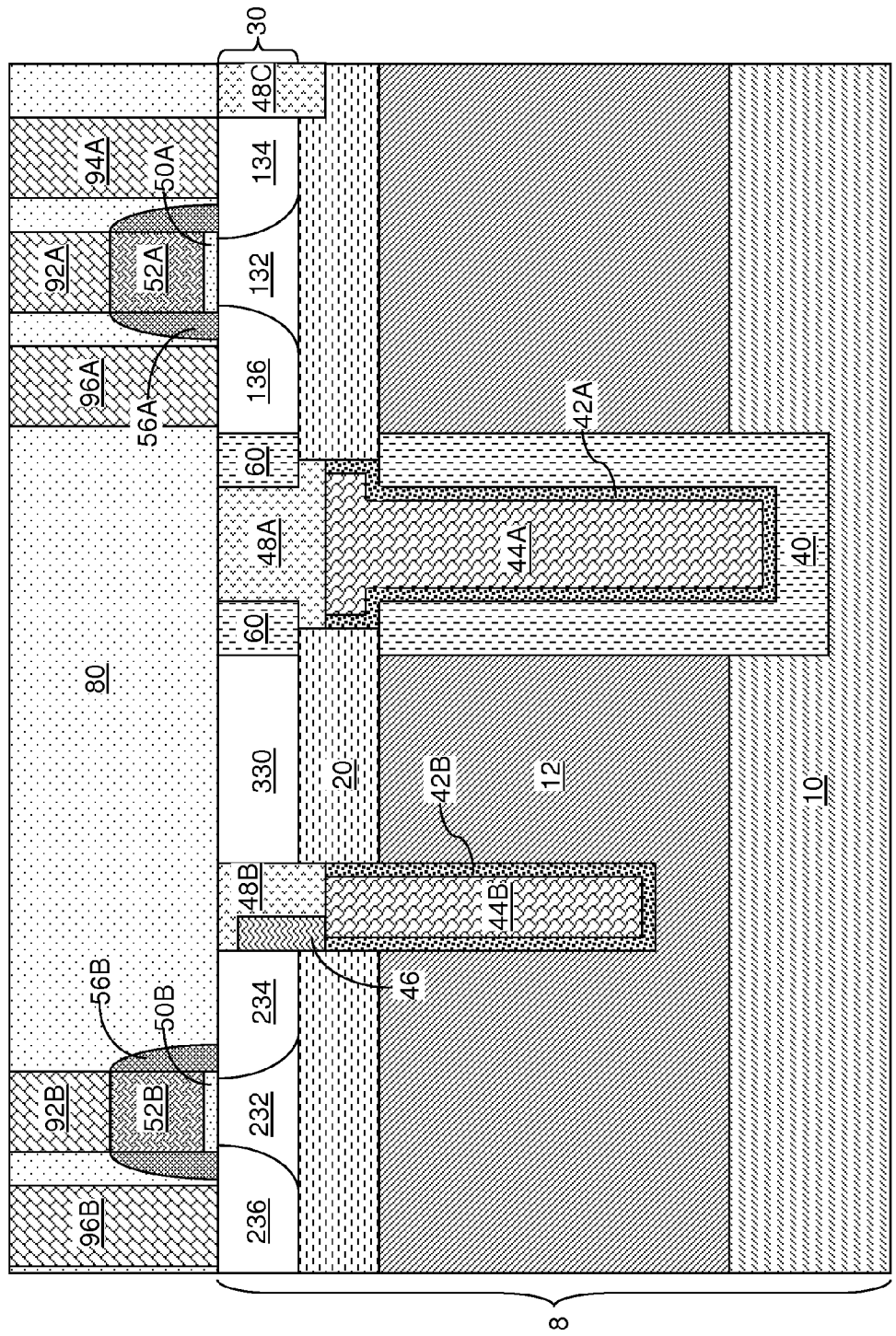
FIG. 15 is a vertical cross-sectional view of the first exemplary semiconductor structure after formation of additional device components and contact via structures according to the first embodiment of the present disclosure.

Referring to FIG. 15, additional device components and/or semiconductor devices can be formed on the first exemplary semiconductor structure. In an illustrative example, additional semiconductor devices can include, but are not limited to, at least one logic field effect transistor formed on, and in, the first top semiconductor region 130 (See FIG. 14) and at least one access transistor formed on, and in, the second top semiconductor region 230 (See FIG. 14). Each logic field effect transistor can include a logic transistor source region 134, a logic transistor body region 132, a logic transistor drain region 136, a logic transistor gate dielectric 50A, a logic transistor gate electrode 52A, and a logic transistor gate spacer 56A. Each access transistor controls the flow of charge carriers into a second conductive material portion 44B, which is an inner electrode of a deep trench capacitor. Each access transistor includes an access transistor source region 234, an access transistor body region 232, an access transistor drain region 236, an access transistor gate dielectric 50B, an access transistor gate electrode 52B, and an access transistor gate spacer 56B.

A contact-level dielectric layer 80 and various contact via structures can be subsequently formed. The contact-level dielectric layer 80 includes a dielectric material such as silicon oxide, silicon nitride, organosilicate glass (OSG), or any other dielectric material that can be employed to form metal interconnect structures as known in the art. The various contact via structures can include, but are not limited to, a logic device source-side contact structure 94A, a logic device drain-side contact structure 96A, a logic device gate-side contact structure 92A, an access transistor drain-side contact structure 96B, and an access transistor gate-side contact structure 92B.

Figure 16:
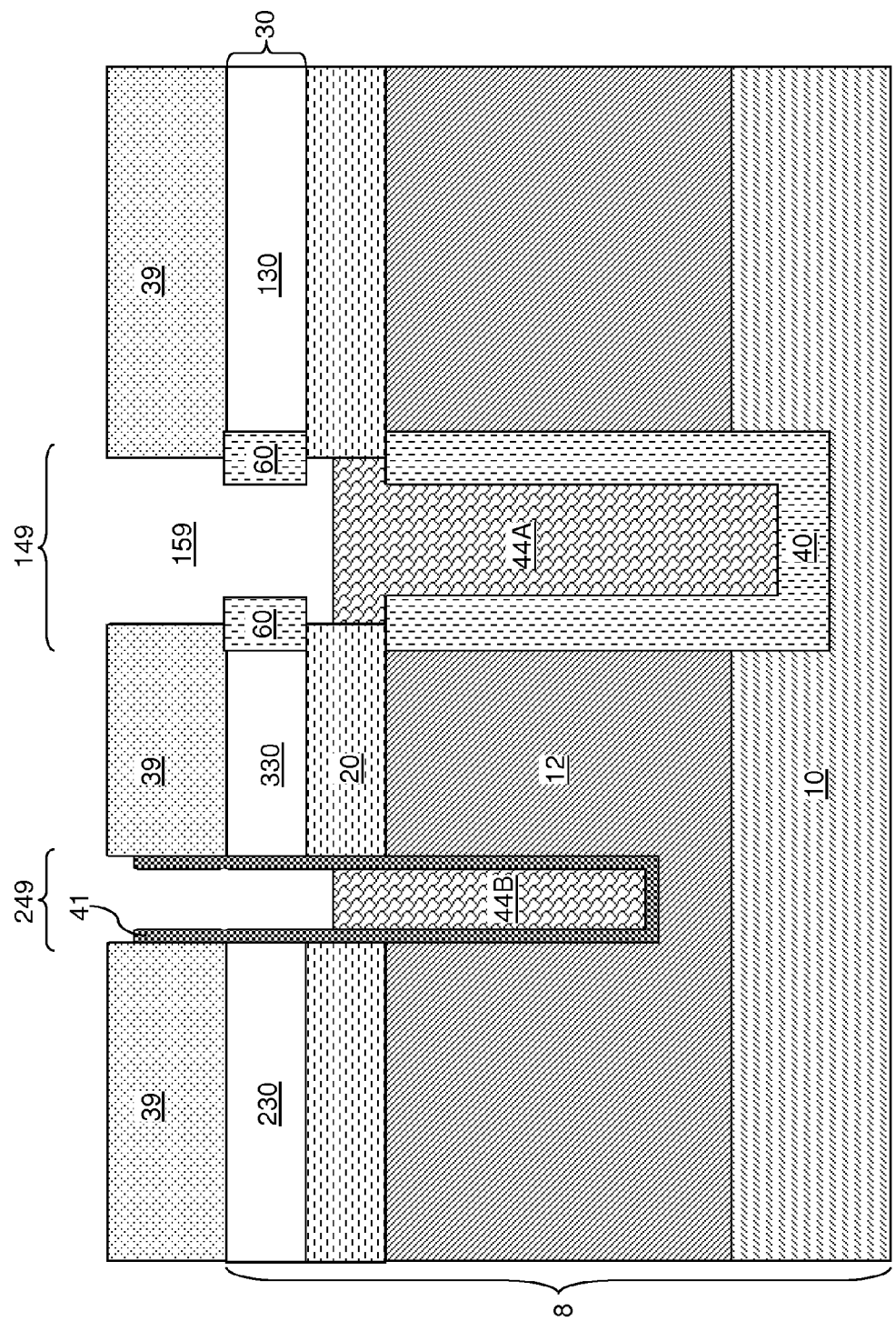
FIG. 16 is a vertical cross-sectional view of a second exemplary semiconductor structure after formation of conductive material portions according to a second embodiment of the present disclosure.

Referring to FIG. 16, a second exemplary semiconductor structure according to a second embodiment of the present disclosure is illustrated. The second exemplary semiconductor structure can be derived from the first exemplary structure of FIG. 8 by omitting the step for removal of the oxygen-impermeable layer 41 of FIG. 9, and by omitting the step for deposition of a contiguous node dielectric layer 42L illustrated in FIG. 10. The conductive material layer is deposited in the same manner as in the first embodiment, and is subsequently recessed to form the first conductive material portion 44A in the first trench 149 and the second conductive material portion 44B in each second trench 249.

Figure 17:
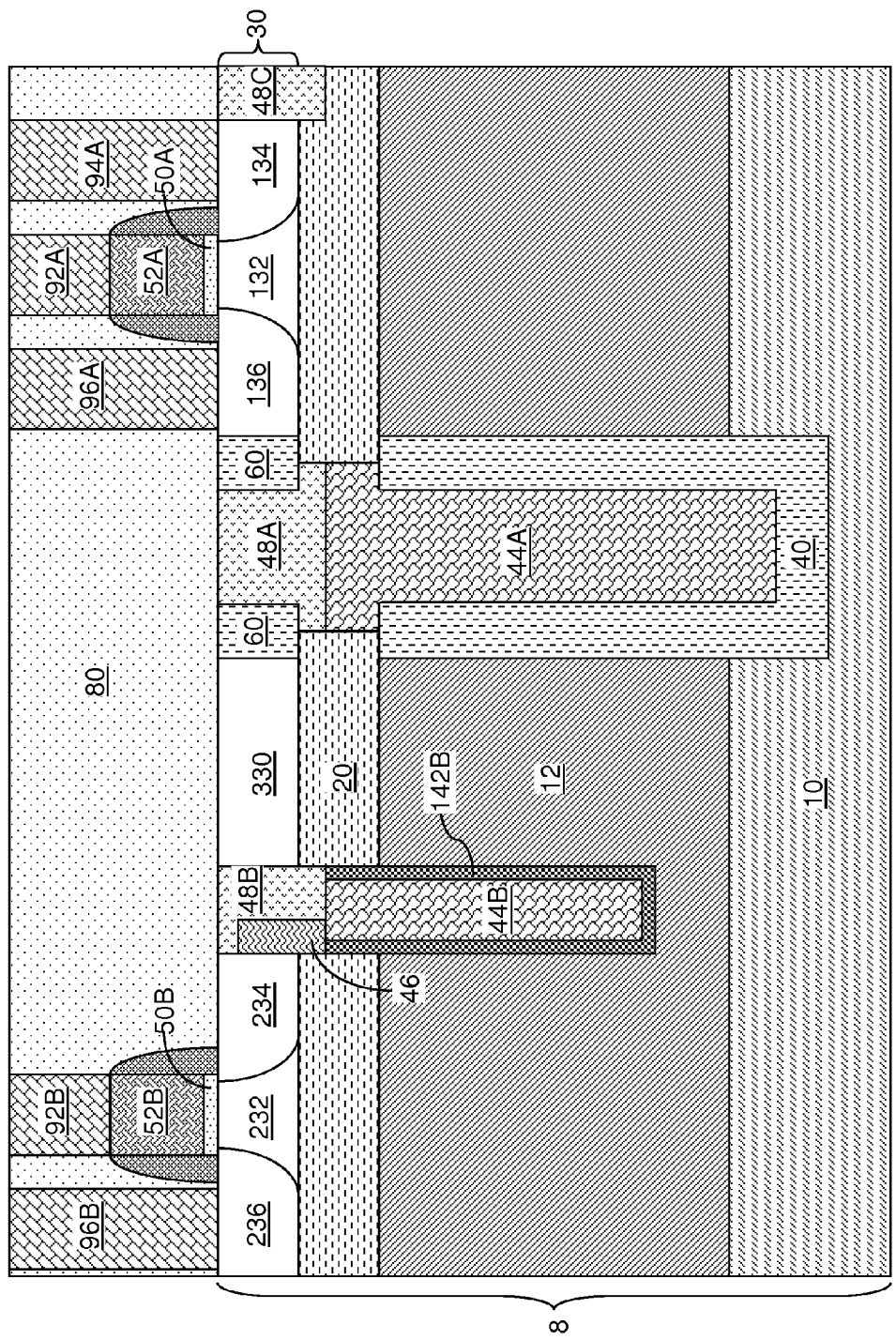
FIG. 17 a vertical cross-sectional view of the second exemplary semiconductor structure after formation of additional device components and contact via structures according to the second embodiment of the present disclosure.

Referring to FIG. 17, the oxygen-impermeable layer 41 is removed from the sidewall of the second top semiconductor portion 230, and a buried strap structure 46 is formed in the same manner as in the first embodiment. A disposable dielectric material layer (not shown) can be optionally employed to facilitate formation of the buried strap structure 46. For example, the disposable dielectric material layer can be deposited over the second exemplary semiconductor structure as illustrated in FIG. 16, and an opening can be formed in the disposable dielectric material layer and the portion of the oxygen-impermeable layer 41 located at the sidewall of the second top semiconductor portion 230. The buried strap structure 46 can be formed employing the same methods as in the processing steps of FIG. 10 in the first embodiment.

The disposable dielectric material layer and physically exposed portions of the oxygen-impermeable layer 41 above the top surface of the second conductive material portion 44B is subsequently removed. In other words, the portion of the oxygen-impermeable layer 41 is removed from above the top surface of the portion of the deposited conductive material within each second trench, i.e., each second conductive material portion 44B. The remaining portion of the oxygen-impermeable layer 41 is a node dielectric 142B. Processing steps of FIGS. 12-15 can be subsequently performed to form the second exemplary semiconductor structure as illustrated in FIG. 17. In the second exemplary semiconductor structure, the first conductive material portion 44A is in direct contact with sidewalls and a bottom surface of the bottom semiconductor oxide portion 40.

Figure 18:
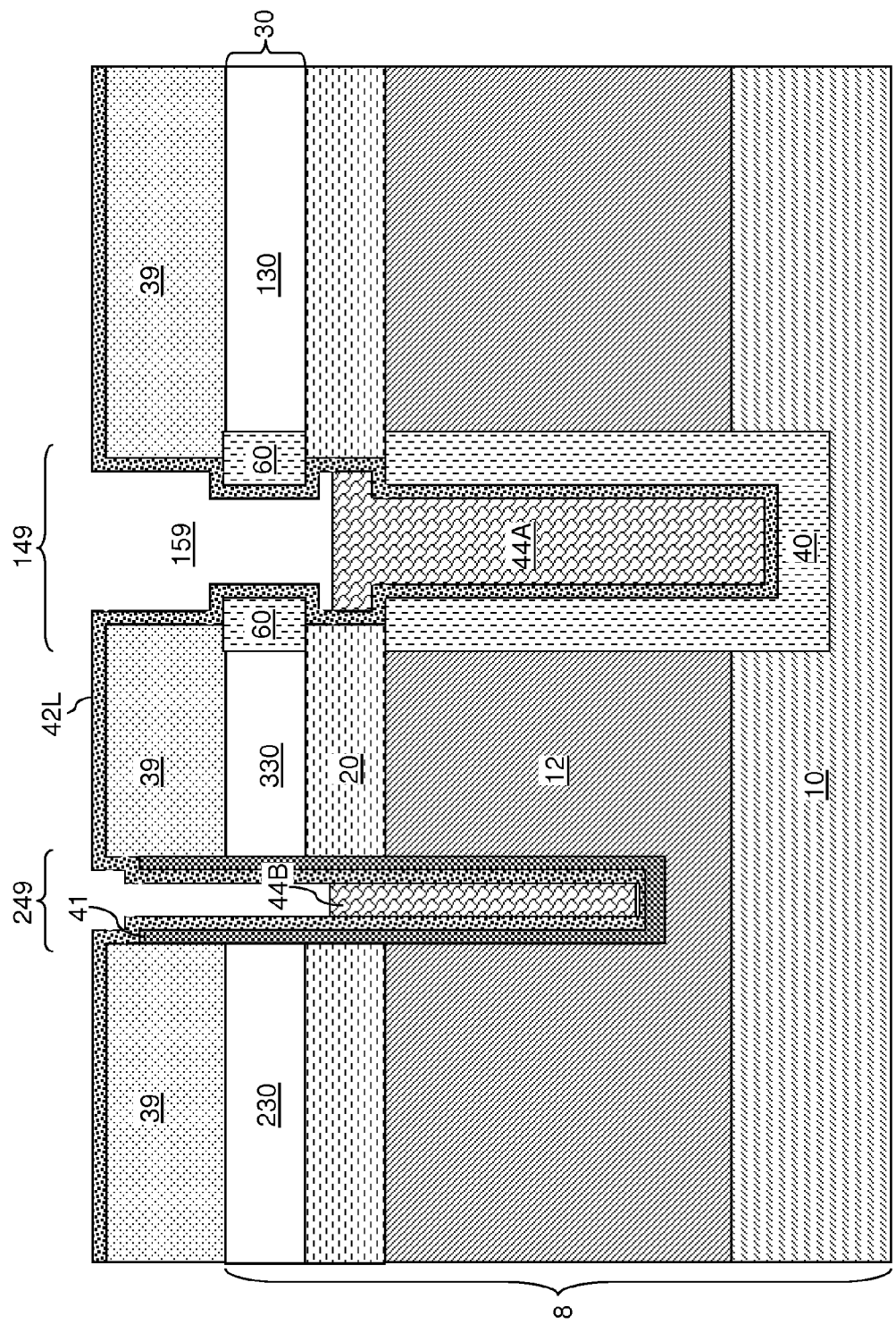
FIG. 18 a vertical cross-sectional view of a third exemplary semiconductor structure after formation of a node dielectric layer and conductive material portions according to a third embodiment of the present disclosure.

Referring to FIG. 18, a third exemplary semiconductor structure according to a third embodiment of the present disclosure is derived from the first exemplary semiconductor structure of FIG. 7 by omitting the processing step of FIG. 8, i.e. by omitting the removal of the oxygen-impermeable layer 41.

Figure 19:
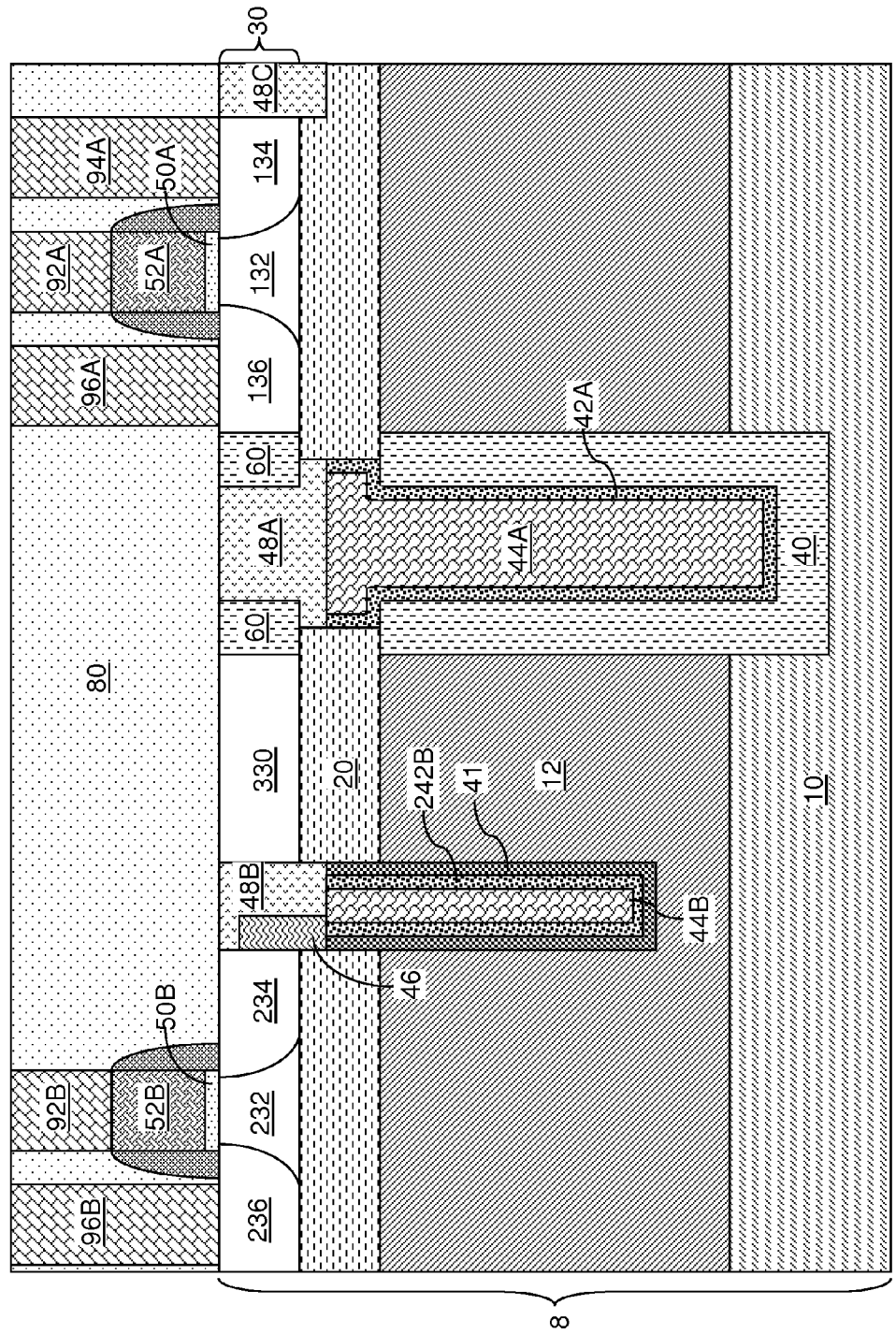
FIG. 19 is a vertical cross-sectional view of the third exemplary semiconductor structure after formation of additional device components and contact via structures according to the third embodiment of the present disclosure.

Referring to FIG. 19, the processing steps of FIGS. 9-15 are subsequently performed. A processing step of FIG. 10 is appropriately modified to remove a portion of the contiguous node dielectric layer 42L and the oxygen-impermeable layer from the sidewalls of the second top semiconductor portion 230 so that the semiconductor surface of the second top semiconductor portion 230 is physically exposed before formation of the buried strap structure 46. For example, the duration and/or etch chemistry of a wet etch employed to form an opening in the contiguous node dielectric layer 42L at step 10 can be modified that an opening is formed through the contiguous node dielectric layer 42L and the oxygen-impermeable layer 41 on the sidewall of the second top semiconductor portion 230.

The remaining portion of the contiguous node dielectric layer 42L within the first trench 149 is herein referred to as a dielectric material liner 42A. The remaining portion of the contiguous node dielectric layer 42L within the second trench 249 is herein referred to as an inner node dielectric layer 242B. The dielectric material liner 42A is in contact with sidewalls and a bottom surface of the first conductive material portion 44A, and in contact with inner sidewalls of the bottom semiconductor oxide portion 40. The stack of the oxygen-impermeable layer 41 and the inner node dielectric layer 242B collectively constitutes a node dielectric (41, 242B) of a deep trench capacitor. The inner node dielectric layer 242B and the dielectric material liner 42A include the same material and have the same thickness. Thus, the node dielectric (41, 242B) includes a portion of the contiguous node dielectric layer 42L.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    forming a first trench and a second trench in a semiconductor-on-insulator (SOI) substrate including a stack, from bottom to top of, at least one semiconductor layer, a buried insulator layer, and a top semiconductor layer;
    providing a contiguous oxygen-impermeable layer on sidewalls of said first trench and second trench in said SOI substrate;
    depositing a fill material layer on said contiguous oxygen-impermeable layer, wherein a cavity is present within said first trench after said depositing said fill material layer in said first trench, and wherein after said depositing said fill material layer said second trench is completely filled with said fill material layer and said contiguous oxygen-impermeable layer;
    isotropically etching said fill material layer, wherein said fill material layer is completely removed within said first trench, and a remaining portion of said fill material layer is present within said second trench;
    removing said oxygen-impermeable layer from said sidewalls of said first trench, but not said second trench;
    oxidizing semiconductor materials on said sidewalls of said first trench, while said oxygen-impermeable layer covers said sidewalls of said second trench; and
    depositing a conductive material in said first trench and said second trench.

2. The method of claim 1, wherein a semiconductor material of said at least one semiconductor layer around said first trench is oxidized to form a bottom semiconductor oxide portion, and a semiconductor material of said top semiconductor layer around said first trench is oxidized to form a top semiconductor oxide portion.

3. The method of claim 1, wherein a first conductive material portion comprising said conductive material is formed in said first trench, and a second conductive material portion comprising said conductive material is formed in said second trench.

4. The method of claim 3, wherein a node dielectric is formed in said second trench, and wherein said second conductive material portion, said node dielectric, and a portion of said at least one semiconductor layer collectively constitute a trench capacitor.

5. The method of claim 4, further comprising removing a portion of said oxygen-impermeable layer from above a top surface of said second conductive material portion within said second trench, wherein a remaining portion of said oxygen-impermeable layer provides said node dielectric.

6. The method of claim 1, wherein a top surface of said remaining portion of said fill material layer is located above a level of a topmost surface of said buried insulator layer.

7. The method of claim 2, further comprising:
    removing said oxygen-impermeable layer from said second trench; and
    depositing a contiguous node dielectric layer on sidewalls of said bottom semiconductor oxide portion and on said sidewalls of said second trench, wherein a portion of said contiguous node dielectric layer provides a node dielectric.

8. The method of claim 2, further comprising depositing a contiguous node dielectric layer on sidewalls of said bottom semiconductor oxide portion and on said sidewalls of said second trench.

9. The method of claim 8, wherein a stack of a portion of said oxygen-impermeable layer and a portion of said contiguous node dielectric layer provides a node dielectric.

10. The method of claim 3, further comprising forming a first shallow trench isolation structure within said first trench and above said first conductive material portion.

11. The method of claim 10, wherein a lower portion of said first shallow trench isolation structure is formed below a horizontal plane including a top surface of said buried insulator layer.

* * * * *